United States Patent
Kim et al.

(10) Patent No.: US 12,419,151 B2
(45) Date of Patent: Sep. 16, 2025

(54) LIGHT-EMITTING DEVICE, DISPLAY DEVICE HAVING SAME, AND METHOD FOR MANUFACTURING SAME

(71) Applicant: Samsung Display Co., Ltd., Yongin-si (KR)

(72) Inventors: Dae Hyun Kim, Yongin-si (KR); Hyun Min Cho, Yongin-si (KR); Hyun Deok Im, Yongin-si (KR); Jong Hyuk Kang, Yongin-si (KR); Keun Kyu Song, Yongin-si (KR); Joo Yeol Lee, Yongin-si (KR); Bek Hyun Lim, Yongin-si (KR); Sung-Chan Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/497,954

(22) Filed: Oct. 30, 2023

(65) Prior Publication Data
US 2024/0063359 A1 Feb. 22, 2024

Related U.S. Application Data

(63) Continuation of application No. 17/843,314, filed on Jun. 17, 2022, now Pat. No. 11,811,012, which is a (Continued)

(30) Foreign Application Priority Data

Apr. 25, 2018 (KR) .................. 10-2018-0048079

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
CPC ... H01L 33/62; H01L 25/0753; H01L 25/167; H01L 27/1259; H01L 33/38; H01L 33/24;
(Continued)

(56) References Cited

U.S. PATENT DOCUMENTS 7,642,704 B2   1/2010 Imai et al.
8,872,214 B2  10/2014 Negishi et al.
(Continued)

FOREIGN PATENT DOCUMENTS

CN   107611153 A   1/2018
CN   107393940 B   2/2020
(Continued)

OTHER PUBLICATIONS

International Search Report of corresponding PCT/KR2018/01146, dated Jan. 25, 2019, 5 pages with English translation.

*Primary Examiner* — Victor A Mandala
(74) *Attorney, Agent, or Firm* — Womble Bond Dickinson (US) LLP

(57) ABSTRACT

A light emitting device may include: a substrate including a plurality of unit light emitting regions; and first to fourth insulating layers sequentially on the substrate. Each of the unit light emitting regions may include: at least one light emitting element on the first insulating layer, the at least one light emitting element having a first end portion and a second end portion in a length direction thereof; first and second partition walls on the substrate, and the first and second partition walls being spaced apart from each other; a first reflective electrode on the first partition wall and a second reflective electrode on the second partition wall; a
(Continued)

first contact electrode on the first reflective electrode, the first contact electrode connecting the first reflective electrode and the first end portion of the light emitting element; a second contact electrode on the second reflective electrode, the second contact electrode connecting the second reflective electrode and the second end portion of the light emitting element; and a conductive pattern provided between the first insulating layer and the first contact electrode, the conductive pattern surrounding the first and second reflective electrodes when viewed on a plane.

19 Claims, 30 Drawing Sheets

Related U.S. Application Data continuation of application No. 17/049,950, filed as application No. PCT/KR2018/011446 on Sep. 27, 2018, now Pat. No. 11,367,823.

(51) Int. Cl.
  *H01L 25/16*       (2023.01)
  *H10D 86/01*       (2025.01)
  *H10H 20/831*      (2025.01)
  *H10H 20/01*       (2025.01)
  *H10H 20/821*      (2025.01)
  *H10H 20/856*      (2025.01)

(52) U.S. Cl.
  CPC ........ *H10D 86/021* (2025.01); *H10H 20/831* (2025.01); *H10H 20/032* (2025.01); *H10H 20/0364* (2025.01); *H10H 20/821* (2025.01); *H10H 20/856* (2025.01)

(58) Field of Classification Search
  CPC ............. H01L 33/60; H01L 2933/0016; H01L 2933/0066; H01L 33/0095; H01L 33/42; H01L 33/44; H01L 33/20; H01L 33/405; H01L 2933/0025; H01L 27/124; H01L 27/1248; H01L 27/156; H10D 86/021; H10D 30/0295; H10D 62/056; H10D 84/8316; H10D 84/858; H10D 10/821; H10D 64/511; H10D 8/043; H10H 20/857; H10H 20/831; H10H 20/032; H10H 20/0364; H10H 20/821; H10H 20/856; F27D 17/30; A23B 2/721; A23B 11/86; A61K 40/405; A61K 40/4272; A61K 40/4214; H05K 5/10; A01N 1/146
  See application file for complete search history.

(56) References Cited

U.S. PATENT DOCUMENTS

| | | | |
|---|---|---|---|
| 8,987,765 B2 | 3/2015 | Bibl et al. | |
| 9,112,112 B2 | 8/2015 | Do et al. | |
| 9,343,627 B2 | 5/2016 | Chae et al. | |
| 9,570,425 B2 | 2/2017 | Do | |
| 9,773,761 B2 | 9/2017 | Do | |
| 10,373,985 B2 | 8/2019 | Kim et al. | |
| 10,461,123 B2 | 10/2019 | Kim et al. | |
| 10,672,946 B2 | 6/2020 | Cho et al. | |
| 10,818,647 B2 | 10/2020 | Kim et al. | |
| 11,811,012 B2* | 11/2023 | Kim | H01L 25/167 |
| 2009/0290273 A1 | 11/2009 | Shih et al. | |
| 2011/0089850 A1 | 4/2011 | Shibata et al. | |
| 2016/0148911 A1 | 5/2016 | Do | |
| 2018/0012876 A1* | 1/2018 | Kim | H10H 20/8252 |
| 2018/0019369 A1* | 1/2018 | Cho | H05K 1/181 |
| 2018/0019377 A1* | 1/2018 | Kim | H10H 20/857 |
| 2018/0026074 A1 | 1/2018 | Lee et al. | |
| 2018/0076273 A1 | 3/2018 | Kim et al. | |
| 2018/0175009 A1* | 6/2018 | Kim | H01L 25/0753 |
| 2019/0019930 A1* | 1/2019 | Do | H01L 24/95 |
| 2019/0244985 A1 | 8/2019 | Kim et al. | |
| 2021/0159250 A1* | 5/2021 | Chang | G09G 3/3233 |
| 2021/0265329 A1* | 8/2021 | Woo | H10H 20/857 |
| 2021/0280632 A1* | 9/2021 | Kim | H10H 20/832 |
| 2021/0288033 A1* | 9/2021 | Lim | H10H 20/821 |
| 2021/0358393 A1* | 11/2021 | Kang | H10H 20/01 |
| 2021/0367183 A1* | 11/2021 | Lim | H01L 25/0753 |
| 2021/0376196 A1* | 12/2021 | Lee | H01L 25/0753 |
| 2021/0399040 A1* | 12/2021 | Chai | H10H 20/835 |
| 2022/0013693 A1* | 1/2022 | Cho | H10H 20/01 |

FOREIGN PATENT DOCUMENTS

| | | |
|---|---|---|
| EP | 3 270 413 A1 | 1/2018 |
| JP | 2006-5290 A | 1/2006 |
| JP | 2013-004792 | 1/2013 |
| JP | 2016-522585 | 7/2016 |
| KR | 10-1244926 | 3/2013 |
| KR | 10-1281081 | 7/2013 |
| KR | 10-1436123 | 11/2014 |
| KR | 10-1490758 | 2/2015 |
| KR | 10-2015-0033622 | 4/2015 |
| KR | 10-2017-0033905 A | 3/2017 |
| KR | 10-2017-0117282 A | 10/2017 |
| KR | 10-2018-0007025 A | 1/2018 |
| KR | 10-2018-0007376 | 1/2018 |
| KR | 10-2018-0072909 | 7/2018 |
| KR | 10-2019-0095638 | 8/2019 |
| WO | WO 2012/057482 A2 | 5/2012 |

* cited by examiner

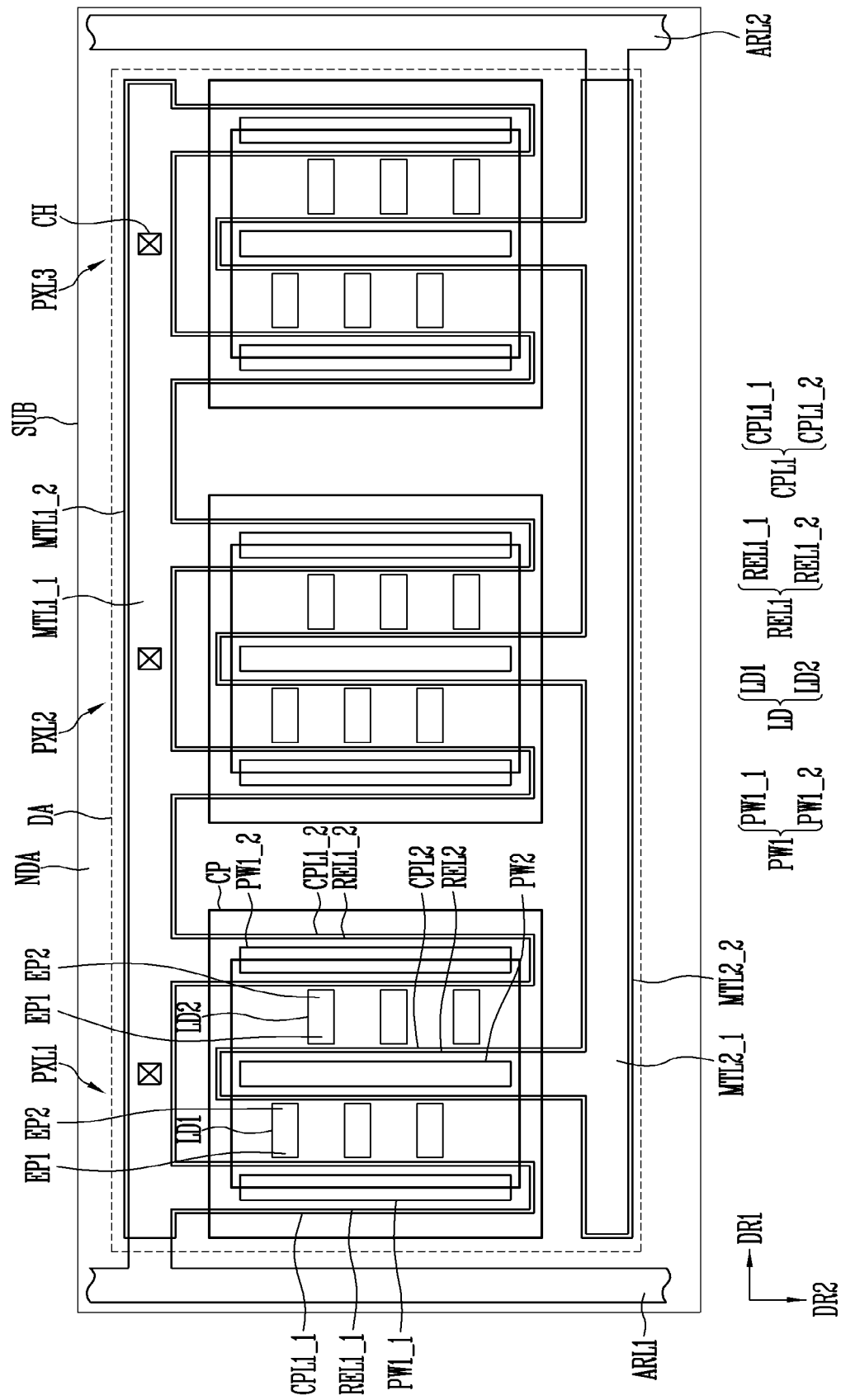

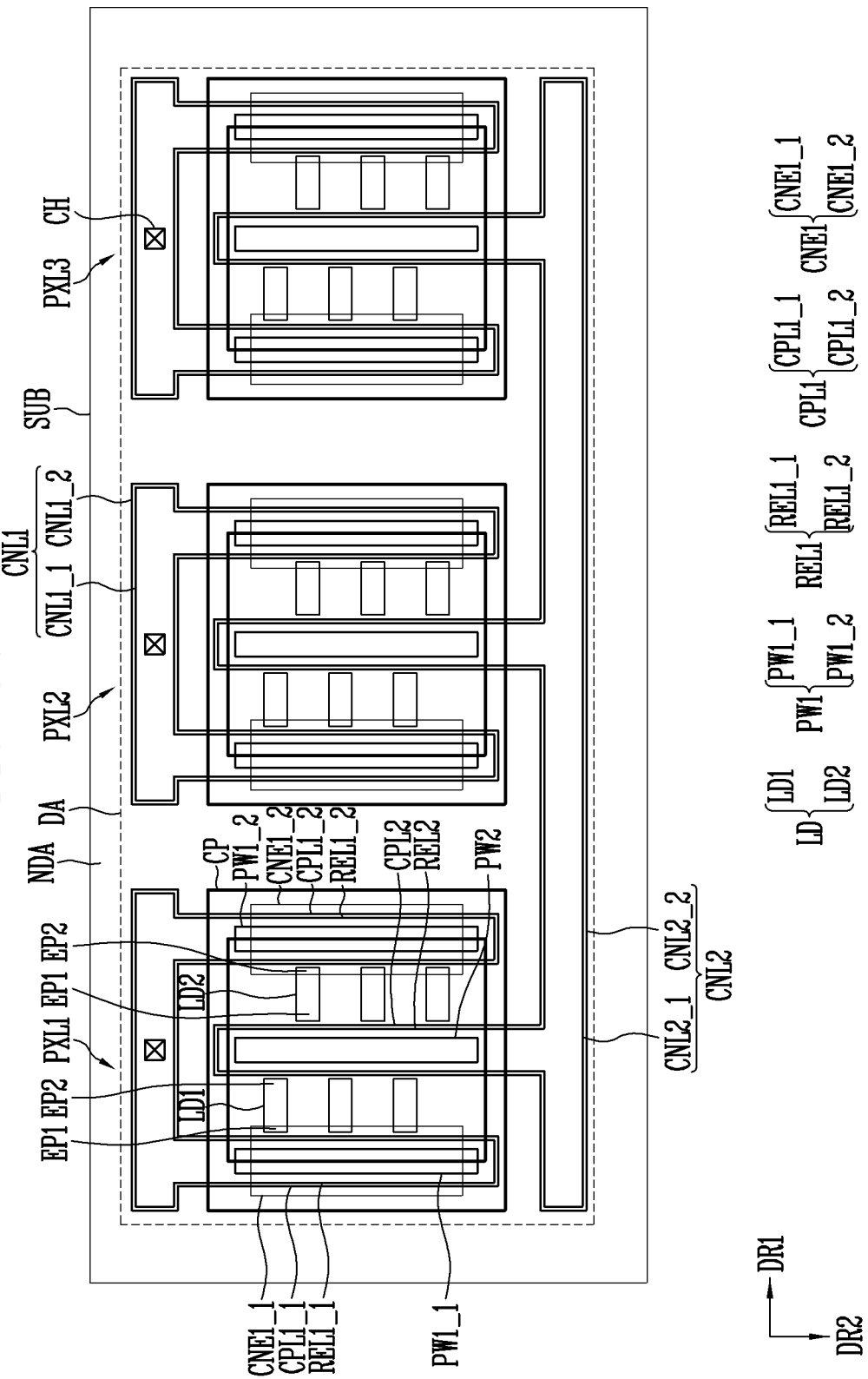

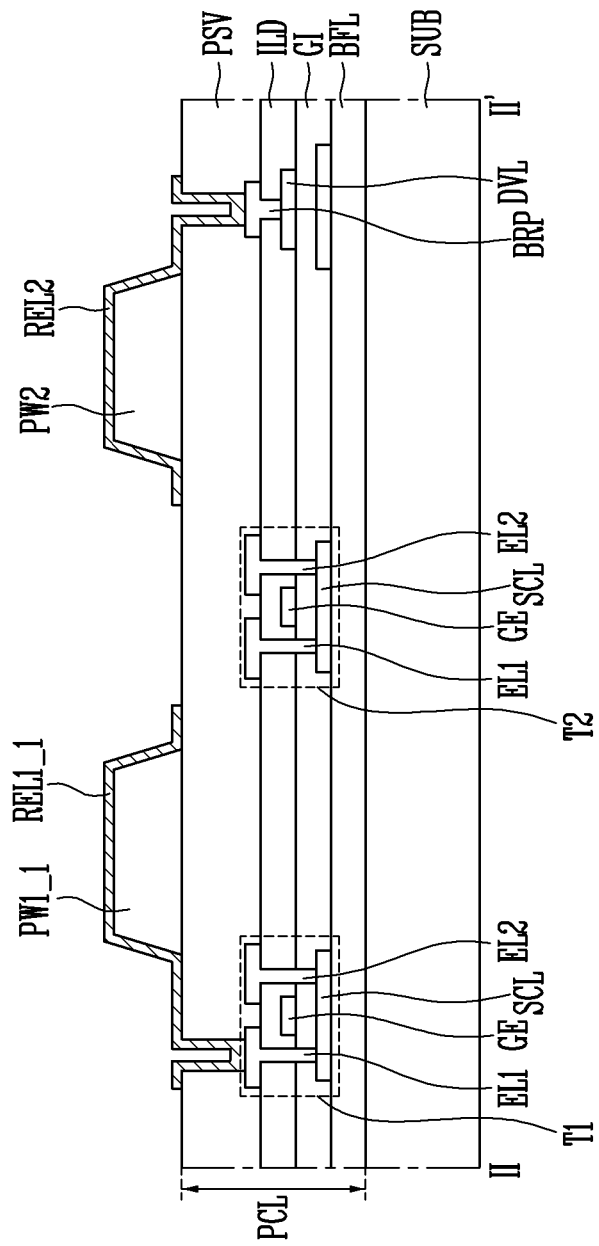

LIGHT-EMITTING DEVICE, DISPLAY DEVICE HAVING SAME, AND METHOD FOR MANUFACTURING SAME

CROSS-REFERENCE TO RELATED APPLICATIONS

This application is a continuation of U.S. patent application Ser. No. 17/843,314, filed on Jun. 17, 2022, which is a continuation of U.S. patent application Ser. No. 17/049,950, filed on Oct. 22, 2020, now U.S. Pat. No. 11,367,823, which is a National Phase Patent Application and claims priority to and the benefit of International Application Number PCT/KR2018/011446, filed on Sep. 27, 2018, which claims priority to and the benefit of Korean Patent Application No. 10-2018-0048079, filed on Apr. 25, 2018 in the Korean Intellectual Property Office, the entire contents of all of which are incorporated herein by reference.

FIELD

Aspects of embodiments of the present invention relate to a light emitting device, a display device having the same, and a fabricating method thereof.

BACKGROUND

Light emitting diodes (herein, referred to as LEDs) exhibit relatively satisfactory durability even in poor environmental conditions and have excellent performance in terms of life span and luminance. Recently, studies for applying such LEDs to various display devices have been actively conducted.

As a part of such studies, there has been developed a technique for fabricating a micro bar type LED that is small to a degree of micro or nano scale using an inorganic crystal structure, e.g., a structure in which a nitride-based semiconductor is grown. For example, the bar type LED may be fabricated in a size small enough to constitute a pixel of a self-luminescent display device, and the like.

SUMMARY

An object of the present invention is to provide a light emitting device having a bar type LED, a display device having the same, and a fabricating method thereof are provided.

Technical Solution

According to an aspect of the present invention, there is provided a light emitting device including: a substrate including a plurality of unit light emitting regions; and first to fourth insulating layers sequentially disposed on the substrate, wherein each of the unit light emitting regions includes: at least one light emitting element provided on the first insulating layer, the at least one light emitting element having a first end portion and a second end portion in a length direction thereof; first and second banks on the substrate, and the first and second banks being spaced apart from each other; a first electrode on the first bank and a second electrode on the second bank; a first contact electrode on the first electrode, the first contact electrode connecting the first electrode and the first end portion of the light emitting element; a second contact electrode on the second electrode, the second contact electrode connecting the second electrode and the second end portion of the light emitting element; and a conductive pattern provided between the first insulating layer and the first contact electrode, the conductive pattern surrounding the first and second electrodes when viewed on a plane.

In an embodiment of the present invention, the conductive pattern may be disposed in a unit light emitting region corresponding to the light emitting element.

In an embodiment of the present invention, each of the unit light emitting regions may further include: a first connection line connected to the first electrode, the first connection line extending in a first direction of the substrate; and a second connection line connected to the second electrode, the second connection line extending in the first direction. The first electrode may include a (1-1)th electrode and a (1-2)th electrode, which branch off from the first connection line to be spaced apart from each other with the second electrode interposed therebetween.

In an embodiment of the present invention, when viewed on a plane, the conductive pattern may partially overlap with the (1-1)th electrode and the (1-2)th electrode.

In an embodiment of the present invention, the first insulating layer may be disposed between the substrate and the light emitting element and between the conductive pattern and the first electrode.

In an embodiment of the present invention, the first insulating layer disposed between the substrate and the light emitting element may support the light emitting element, and the first insulating layer disposed between the conductive pattern and the first electrode may protect the first electrode.

In an embodiment of the present invention, the light emitting device may further include: a first capping layer on the first electrode to cover the first electrode; and a second capping layer on the second electrode to cover the second electrode.

In an embodiment of the present invention, the second insulating layer may be provided over the light emitting element to expose the first and second end portions of the light emitting element, the third insulating layer may be provided over the first contact electrode to protect the first contact electrode, and the fourth insulating layer may be provided over the second contact electrode to protect the second contact electrode.

In an embodiment of the present invention, the light emitting element may include: a first semiconductor layer doped with a first conductive dopant; a second semiconductor layer doped with a second conductive dopant; and an active layer disposed between the first semiconductor layer and the second semiconductor layer.

In an embodiment of the present invention, the light emitting element may include a column-shaped light emitting diode having a micro or nano scale.

According to one or more embodiments of the present invention, a display device having a light emitting device includes: a substrate including a display region and a non-display region; a pixel circuit layer provided in the display region, the pixel circuit layer including at least one transistor; and a display element layer including first to fourth insulating layers sequentially disposed on the pixel circuit layer and a plurality of unit light emitting regions from which lights are emitted, wherein each of the unit light emitting regions includes: at least one light emitting element on the first insulating layer, the at least one light emitting element having a first end portion and a second end portion in a length direction thereof; first and second banks on the pixel circuit layer, and the first and second banks being spaced apart from each other; a first electrode on the first bank and a second electrode on the second bank; a first contact electrode on the first electrode, the first contact electrode connecting the first electrode and the first end portion of the light emitting element; a second contact electrode on the second electrode, the second contact electrode connecting the second electrode and the second end portion of the light emitting element; and a conductive pattern provided between the first insulating layer and the first contact electrode, the conductive pattern surrounding the first and second electrodes when viewed on a plane.

According to one or more embodiments of the present invention, a method of fabricating a display device includes: providing a substrate including a plurality of unit light emitting regions; forming first and second banks spaced apart from each other at a distance in each of the unit light emitting regions; forming, on the substrate including the first and second banks, a first electrode, a second electrode spaced apart from the first electrode on a same plane, a first alignment line connected to the first electrode, and a second alignment line connected to the second electrode; forming a first insulating material layer on the first and second electrodes; forming a conductive pattern on the first insulating material layer to overlap with the first electrode; self-aligning a plurality of light emitting elements between the first and second electrodes by dropping a solution including the plurality of light emitting elements onto the first insulating material layer and applying a voltage to each of the first alignment line and the second alignment line; forming a first insulating material pattern exposing a portion of the first electrode by patterning the first insulating material layer; forming a second insulating material pattern exposing a first end portion of each of the light emitting elements, a portion of the first electrode, and the conductive pattern by coating a second insulating material layer on the first insulating material pattern and then patterning the second insulating material layer; removing the first alignment line and the second alignment line on the substrate; forming a first contact electrode connecting the exposed first end portion of each of the light emitting elements and the first electrode; forming a third insulating layer covering the first contact electrode on the first contact electrode, and forming first and second insulating layers exposing a second end portion of each of the light emitting elements and the second electrode by patterning the first and second insulating material patterns; forming a second contact electrode connecting the exposed second end portion of each of the light emitting elements and the second electrode; and forming a fourth insulating layer covering the second contact electrode on the second contact electrode.

Advantageous Effects

According to an aspect of embodiments of the present invention, there may be provided a light emitting device capable of minimizing or reducing a defect while improving the efficiency of light, a display device having the light emitting device, and a fabricating method of the display device.

BRIEF DESCRIPTION OF THE DRAWINGS

FIGS. 9A to 9H are schematic plan views sequentially illustrating a fabricating method of a display device including a plurality of unit light emitting regions.

FIGS. 10A to 10M are cross-sectional views sequentially illustrating a fabricating method of the display device shown in FIG. 8.

MODE FOR THE INVENTION

Figure 1:
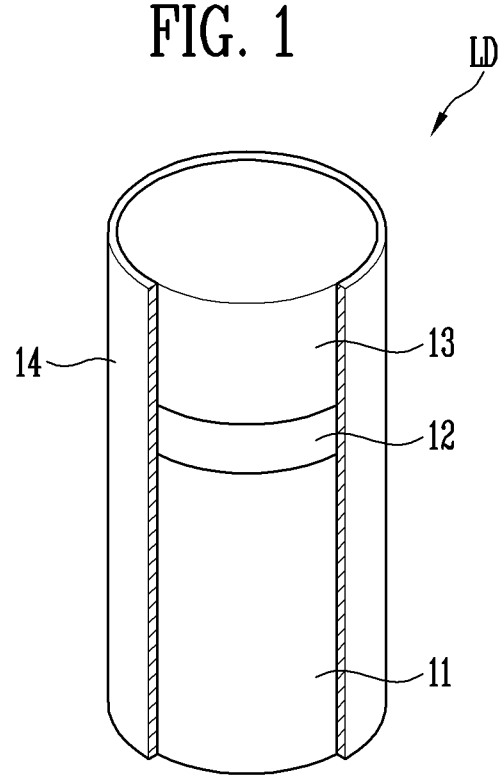
FIG. 1 is a perspective view illustrating a light emitting element according to an embodiment of the present invention.

The present invention may apply various changes and different shapes and is, therefore only illustrated in details with respect to some particular examples. However, the described examples do not limit the present invention to any particular shapes but apply to all changes and equivalent materials and variations. The drawings included may be illustrated such that the figures are enlarged or exaggerated for ease of understanding.

Like numbers refer to like elements throughout. In the drawings, the thicknesses of certain lines, layers, components, elements, or features may be exaggerated for clarity. It is to be understood that, although the terms "first", "second", etc. may be used herein to describe various elements, these elements should not be limited by these terms. These terms are used to distinguish one element from another element. Thus, a "first" element discussed below could also be termed a "second" element without departing from the teachings of the present invention. As used herein, the singular forms are intended to include the plural forms as well, unless the context clearly indicates otherwise.

It is to be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element, such as a layer, region, substrate, or plate, is placed "on" or "above" another element indicates not only a case where the element is placed "directly on" or "just above" the other element but also a case in which a further element is interposed between the element and the other element. Similarly, an expression that an element, such as a layer, region, substrate, or plate, is placed "beneath" or "below" another element indicates not only a case in which the element is placed "directly beneath" or "just below" the other element but also a case in which a further element is interposed between the element and the other element.

Herein, some exemplary embodiments of the present invention will be described in further detail with reference to the accompanying drawings.

FIG. 1 is a perspective view illustrating a light emitting element according to an embodiment of the present invention. Although a cylindrical column-shaped light emitting element LD is illustrated in FIG. 1, the present invention is not limited thereto.

Referring to FIG. 1, the light emitting element LD according to the embodiment of the present invention may include a first semiconductor layer 11, a second semiconductor layer 13, and an active layer 12 interposed between the first and second semiconductor layers 11 and 13.

In an example, the light emitting element LD may be implemented with a stack structure in which the first semiconductor layer 11, the active layer 12, and the second semiconductor layer 13 are sequentially stacked.

According to an embodiment of the present invention, the light emitting element LD may be provided in a bar shape extending along a direction. When assuming that the extending direction of the light emitting element LD is a length direction, the light emitting element LD may have an end portion and another end portion along the length direction.

In an embodiment of the present invention, one of the first and second semiconductor layers 11 and 13 may be disposed at one end portion, and the other of the first and second semiconductor layers 11 and 13 may be disposed at the other end portion.

In an embodiment of the present invention, the light emitting element LD may be provided in a cylindrical column shape. However, the term "bar type" may include a rod-like shape or bar-like shape, which is long in its length direction (i.e., its aspect ratio is greater than 1), such as a cylindrical column or a polygonal column. For example, the light emitting element LD may have a length greater than a diameter thereof.

The light emitting element LD may be fabricated small enough to have a diameter and/or a length, for example, to a degree of micro or nano scale.

However, the size of the light emitting element LD according to embodiments of the present invention is not limited thereto, and the size of the light emitting element LD may be changed to correspond to required conditions of a display device to which the light emitting element LD is applied.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and may include a semiconductor layer doped with a first conductive dopant such as Si, Ge, or Sn.

However, the material constituting the first semiconductor layer 11 is not limited thereto, and any of various materials may be included in the first semiconductor layer 11.

The active layer 12 is formed on the first semiconductor layer 11, and may be formed in a single or multiple quantum well structure. According to an embodiment of the present invention, a clad layer (not shown) doped with a conductive dopant may be formed on the top and/or the bottom of the active layer 12. In an example, the clad layer may be implemented as an AlGaN layer or InAlGaN layer. In addition, it will be apparent that a material such as AlGaN or InAlGaN may also be used for the active layer 12.

When an electric field having a voltage (e.g., a predetermined voltage) or more is applied to both ends of the light emitting element LD, the light emitting element LD emits light as electron-hole pairs are combined in the active layer 12.

The second semiconductor layer 13 is formed on the active layer 12, and may include a semiconductor layer having a type different from that of the first semiconductor layer 11. In an example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a semiconductor layer doped with a second conductive dopant such as Mg.

However, the material constituting the second semiconductor layer 13 is not limited thereto, and any of various materials may be included in the second semiconductor layer 13.

According to an embodiment of the present invention, the light emitting element LD may further include another phosphor layer, another active layer, another semiconductor layer, and/or another electrode layer on the top and/or the bottom of each layer, in addition to the first semiconductor layer 11, the active layer 12, and the second semiconductor layer 13.

Also, the light emitting element LD may further include an insulative film 14. However, according to an embodiment of the present invention, the insulative film 14 may be omitted, or may be provided to cover only portions of the first semiconductor layer 11, the active layer 12, and the second semiconductor layer 13.

For example, the insulative film 14 may be provided at a portion except both end portions of the light emitting element LD, such that both end portions of the light emitting element LD may be exposed.

For convenience of description, FIG. 1 illustrates a state in which a portion of the insulative film 14 is removed. In an actual light emitting element LD, the entire side surface of a cylinder may be surrounded by the insulative film 14.

The insulative film 14 may be provided to surround at least a portion of outer circumferential surfaces of the first semiconductor layer 11, the active layer 12, and/or the second semiconductor layer 13. In an example, the insulative film 14 may be provided to surround at least the outer circumferential surface of the active layer 12.

According to an embodiment of the present invention, the insulative film 14 may include a transparent insulating material. For example, the insulative film 14 may include at least one insulating material selected from the group consisting of $SiO_2$, $Si_3N_4$, $Al_2O_3$, and $TiO_2$. However, the present invention is not limited thereto, and any of various materials having insulating properties may be used.

When the insulative film 14 is provided in the light emitting element LD, the active layer 12 may be prevented or substantially prevented from being short-circuited with a first electrode (not shown) and/or a second electrode (not shown).

Further, when the insulative film 14 is formed, a surface defect occurring in the light emitting element LD may be minimized or reduced, such that the lifespan and efficiency of the light emitting element LD may be improved. Further, when a plurality of light emitting elements LD are densely disposed, the insulative film 14 may prevent or substantially prevent an unwanted short circuit that may occur between the light emitting elements LD.

The above-described light emitting element LD may be used as a light emitting source for any of various display devices. In an example, the light emitting element LD may be used for lighting devices or self-luminescent display devices.

Figure 2A:
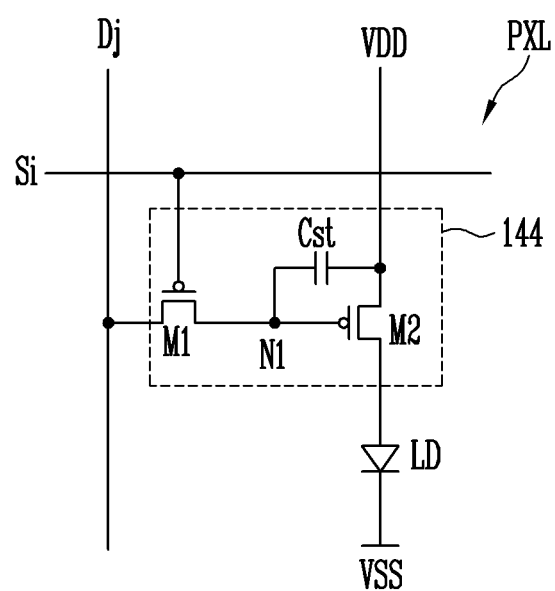
FIGS. 2A and 2B are circuit diagrams illustrating a unit light emitting region of a light emitting device according to an embodiment of the present invention.
Figure 2B:
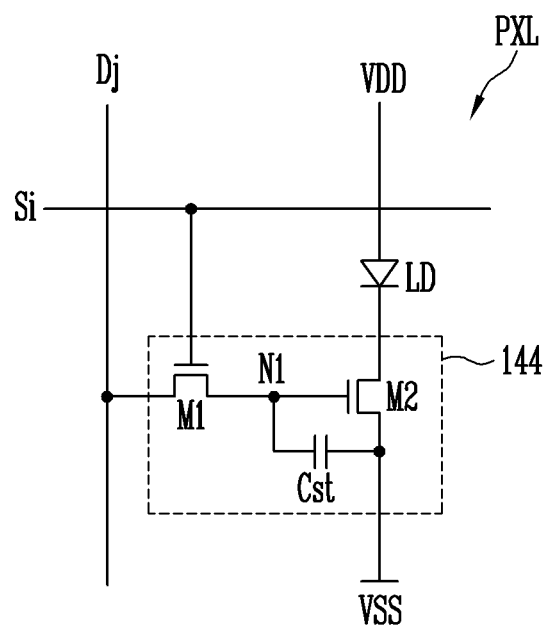

FIGS. 2A and 2B are circuit diagrams illustrating a unit light emitting region of a light emitting device according to an embodiment of the present invention.

In particular, FIGS. 2A and 2B illustrate examples of a pixel constituting an active light emitting display panel. In an embodiment of the present invention, the unit light emitting region may include one pixel.

Referring to FIG. 2A, a pixel PXL may include at least one light emitting element LD and a driving circuit 144 connected to the light emitting element LD to drive the light emitting element LD.

A first electrode (e.g., an anode electrode) of the light emitting element LD is connected to a first driving voltage VDD via the driving circuit 144, and a second electrode (e.g., a cathode electrode) of the light emitting element LD is connected to a second driving voltage VSS.

The first driving voltage VDD and the second driving voltage VSS may have different potentials. In an example, the second driving voltage VSS may have a potential lower by a threshold voltage of the light emitting element LD than that of the first driving voltage VDD.

The light emitting element LD may emit light with a luminance corresponding to a driving current controlled by the driving circuit 144.

Meanwhile, although FIG. 2A illustrates an embodiment in which only one light emitting element LD is included in the pixel PXL, the present invention is not limited thereto. For example, the pixel PXL may include a plurality of light emitting elements LD connected in parallel to each other.

According to an embodiment of the present invention, the driving circuit 144 may include first and second transistors M1 and M2 and a storage capacitor Cst. However, the structure of the driving circuit 144 is not limited to the embodiment shown in FIG. 2A.

A first electrode of the first transistor (switching transistor) M1 is connected to a data line Dj, and a second electrode of the first transistor M1 is connected to a first node N1. The first electrode and the second electrode of the first transistor M1 are different electrodes. For example, when the first electrode is a source electrode, the second electrode may be a drain electrode. In addition, a gate electrode of the first transistor M1 is connected to a scan line Si.

The first transistor M1 is turned on when a voltage (e.g., a low voltage) at which the first transistor M1 can be turned on is supplied from the scan line Si, to electrically connect the data line Dj and the first node N1. A data signal of a corresponding frame is supplied to the data line Dj. Accordingly, the data signal is transferred to the first node N1. The data signal transferred to the first node N1 is charged in the storage capacitor Cst.

A first electrode of the second transistor (driving transistor) M2 is connected to the first driving voltage VDD, and a second electrode of the second transistor M2 is connected to the first electrode of the light emitting element LD. In addition, a gate electrode of the second transistor M2 is connected to the first node N1. The second transistor M2 controls an amount of driving current supplied to the light emitting element LD, corresponding to a voltage of the first node N1.

One electrode of the storage capacitor Cst is connected to the first driving voltage VDD, and the other electrode of the storage capacitor Cst is connected to the first node N1. The storage capacitor Cst charges a voltage corresponding to the data signal supplied to the first node N1, and maintains the charged voltage until a data signal of a next frame is supplied.

For convenience, FIG. 2A illustrates the driving circuit 144 having a relatively simple structure, which includes the first transistor M1 for transferring the data signal to the inside of the pixel PXL, the storage capacitor Cst for storing the data signal, and the second transistor M2 for supplying a driving current corresponding to the data signal to the light emitting element LD.

However, the present invention is not limited thereto, and the structure of the driving circuit 144 may be variously modified and implemented. In an example, it will be apparent that the driving circuit 144 may further include at least one transistor element such as a transistor element for compensating for a threshold voltage of the second transistor M2, a transistor element for initializing the first node N1, and/or a transistor for controlling a light emitting time of the light emitting element LD, or other circuit elements such as a boosting capacitor for boosting a voltage of the first node N1.

Although FIG. 2A illustrates that both of the transistors, e.g., the first and second transistors M1 and M2 included in the driving circuit 144 are implemented with a P-type transistor, the present invention is not limited thereto. That is, at least one of the first and second transistors M1 and M2 may be implemented with an N-type transistor.

Referring to FIG. 2B, according to an embodiment of the present invention, the first and second transistors M1 and M2 may be implemented with an N-type transistor. The configuration and operation of a driving circuit 144 shown in FIG. 2B are similar to those of the driving circuit 144 of FIG. 2A, except that connection positions of some components are changed due to a change in the type of transistors. Therefore, a detailed description thereof will be omitted.

Figure 3:
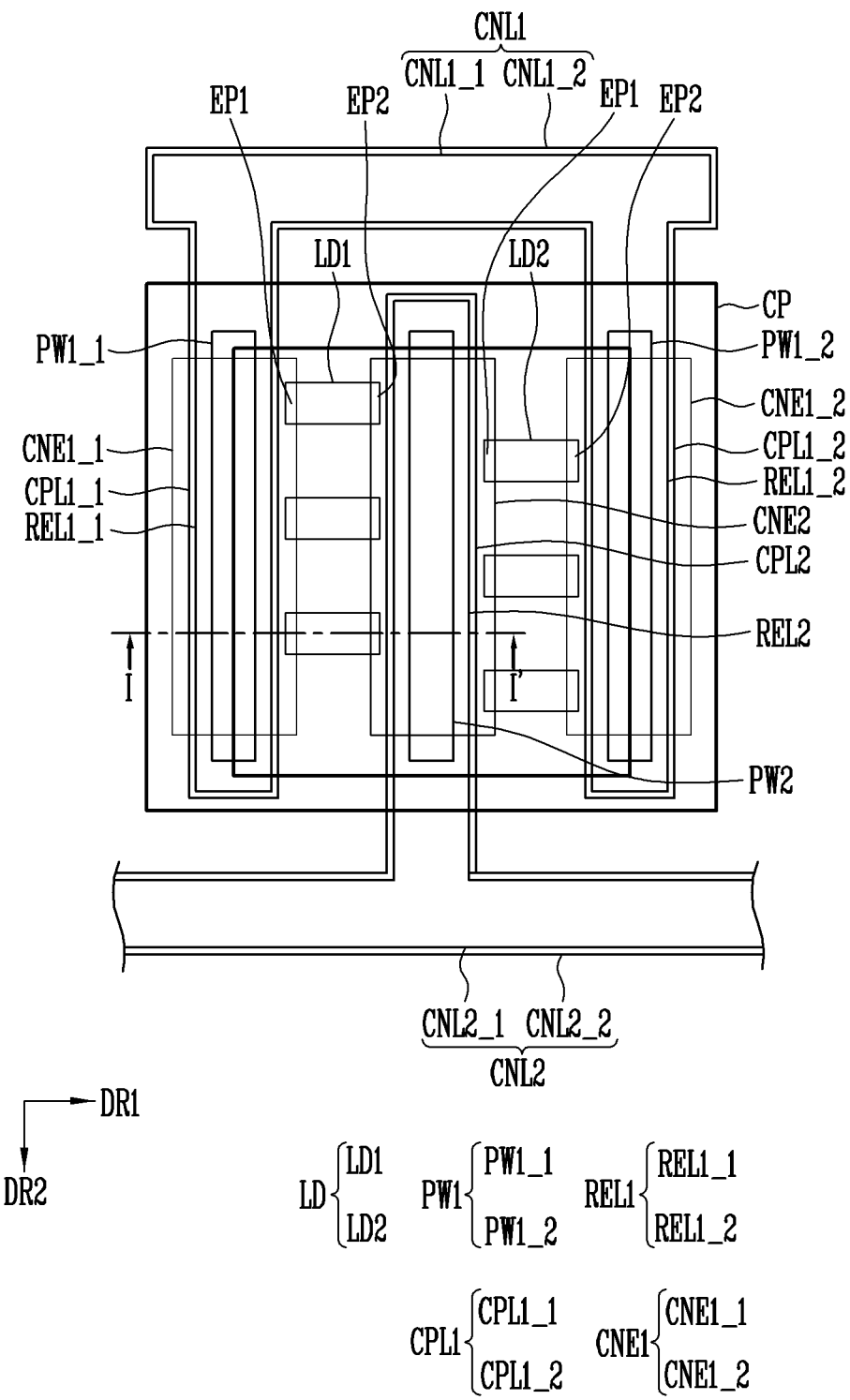
FIG. 3 is a plan view illustrating a unit light emitting region of a light emitting device including the light emitting element of FIG. 1.
Figure 4:
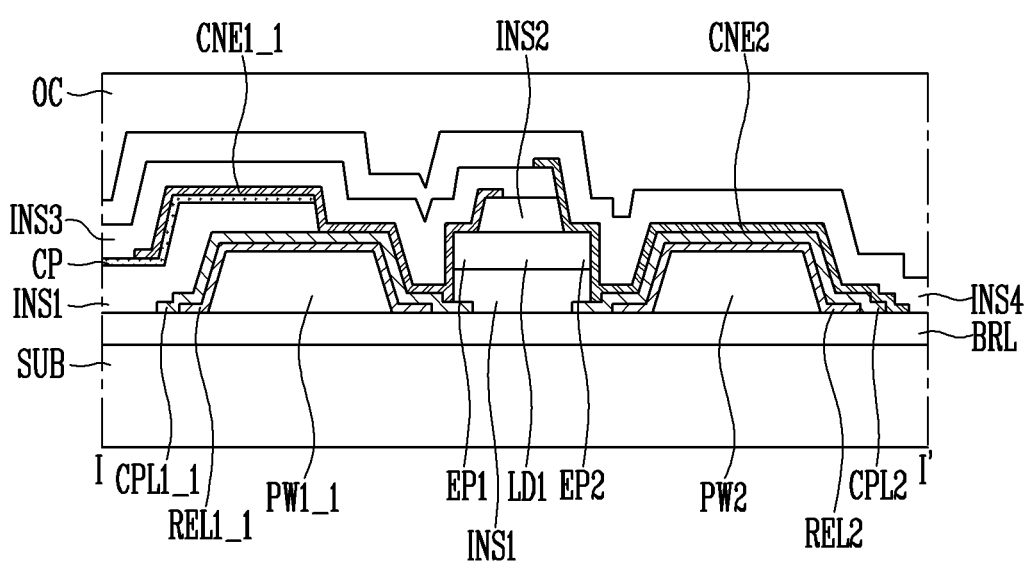
FIG. 4 is a cross-sectional view taken along the line I-I' of FIG. 3.

FIG. 3 is a plan view illustrating a unit light emitting region of a light emitting device including the light emitting element of FIG. 1; and FIG. 4 is a cross-sectional view taken along line I-I' of FIG. 3.

In FIG. 3, light emitting elements being arranged in a horizontal direction is illustrated for convenience of description, but the arrangement of the light emitting elements is not limited thereto. For example, the light emitting elements may be arranged in an oblique direction between first and second electrodes. Also, in FIG. 3, the unit light emitting region may be a pixel region of each of a plurality of pixels included in a light emitting display panel.

In addition, although an embodiment in which one light emitting element is provided in a unit light emitting region is illustrated in FIG. 3, the present invention is not limited thereto. For example, a plurality of light emitting elements may be provided in the unit light emitting region.

Referring to FIGS. 1 to 4, the light emitting device according to the embodiment of the present invention may include a substrate SUB, a barrier layer BRL, a plurality of light emitting elements LD, first and second banks PW1 and PW2, first and second electrodes REL1 and REL2, and first and second contact electrodes CNE1 and CNE2.

The substrate SUB may include an insulative material such as glass, organic polymer or quartz. Also, the substrate SUB may be made of a material having flexibility to be bendable or foldable, and have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed.

The barrier layer BRL may prevent or substantially prevent an impurity from being diffused into the light emitting elements LD.

Each of the light emitting elements LD may include a first semiconductor layer 11, a second semiconductor layer 13, and an active layer 12 interposed between the first and second semiconductor layers 11 and 13. In some embodiments, the light emitting element LD may further include an electrode layer (not shown) provided on the top of the second semiconductor layer 13.

The electrode layer may include a metal or metal oxide. For example, the electrode layer may be formed of one or a mixture of chromium (Cr), titanium (Ti), aluminum (Al), gold (Au), nickel (Ni), ITO, and an oxide or alloy thereof, but the present invention is not limited thereto.

When the electrode layer is included, the second semiconductor layer 13 and the second electrode REL2 can be joined at a temperature lower than that required in a process of forming the second contact electrode CNE2 at a joint of the second semiconductor layer 13 and the second electrode REL2.

The light emitting element LD may include a first end portion EP1 and a second end portion EP2 along a first direction DR1. One of the first and second semiconductor layers 11 and 13 may be disposed at the first end portion EP1, and the other of the first and second semiconductor layers 11 and 13 may be disposed at the second end portion EP2. In an embodiment of the present invention, each light emitting element LD may emit light of any one of red, green, blue, and white.

A second insulating layer INS2 covering a portion of an upper surface of the light emitting element LD may be provided over the light emitting element LD. Therefore, both the end portions EP1 and EP2 of the light emitting element LD may be exposed to the outside.

In an embodiment of the present invention, the light emitting elements LD may include a light emitting element LD1 disposed at one side of the second electrode REL2 and a second light emitting element LD2 disposed at the other side of the second electrode REL2. When viewed on a plane, the first light emitting element LD1 and the second light emitting element LD2 may be spaced apart from each other with the second electrode REL2 interposed therebetween.

The first and second banks PW1 and PW2 may define a unit light emitting region in one pixel PXL. The first and second banks PW1 and PW2 may be provided on the substrate SUB to be spaced apart from each other at a certain distance. The first and second banks PW1 and PW2 may be provided on the substrate SUB to spaced apart from each other at a distance equal to or larger than the length of one light emitting element LD.

The first and second banks PW1 and PW2 may include an insulating material including an inorganic material or an organic material, but the present invention is not limited thereto. The first and second banks PW1 and PW2 may have a trapezoidal shape of which side surfaces are inclined at an angle (e.g., a predetermined angle) However, the present invention is not limited thereto, and the first and second banks PW1 and PW2 may have any of various shapes, such as a semi-elliptical shape, a circular shape, and a quadrangular shape.

In an embodiment of the present invention, the first bank PW1 may include a (1-1)th bank PW1_1 disposed at one side of the second bank PW2 and a (1-2)th bank PW1_2 disposed at the other side of the second bank PW2.

When viewed on a plane, the (1-1)th bank PW1_1 and the (1-2)th bank PW1_2 may be spaced apart from each other with the second bank PW2 interposed therebetween.

The (1-1)th bank PW1_1, the second bank PW2, and the (1-2)th bank PW1_2 may be disposed on the same plane on the substrate SUB, and have the same height.

The first electrode REL1 may be provided on the first bank PW1. The first electrode REL1 is disposed adjacent to one of the first and second end portions EP1 and EP2 of each light emitting element LD, and may be electrically connected to a corresponding light emitting element LD through the first contact electrode CNE1.

When viewed on a plane, the first electrode REL1 may include a (1-1)th electrode REL1_1 and a (1-2)th electrode REL1_2, which branch off to one side and the other side of the second electrode REL2. The second electrode REL2 may be disposed between the (1-1)th electrode REL1_1 and the (1-2)th electrode REL1_2.

The (1-1)th electrode REL1_1 and the (1-2)th electrode REL1_2 may have a bar shape along a second direction DR2 intersecting the first direction DR1. The (1-1)th electrode REL1_1 and the (1-2)th electrode REL1_2 may be connected to a (1-1)th connection line CNL1_1 extending along the first direction DR1.

The second electrode REL2 may be provided between the first light emitting element LD1 and the second light emitting element LD2 on the substrate SUB. The second electrode REL2 may be electrically connected to a (2-1)th connection line CNL2_1 extending along the first direction DR1.

The first and second electrodes REL1 and REL2 may be provided to correspond to the shapes of the first and second banks PW1 and PW2. Therefore, the first electrode REL1 may have a slope corresponding to the gradient of the first bank PW1, and the second electrode REL2 may have a slope corresponding to the gradient of the second bank PW2.

In an embodiment of the present invention, the first and second electrodes REL1 and REL2 may be made of a conductive material having a constant reflexibility. The first and second electrodes REL1 and REL2 may allow lights emitted from both the end portions EP1 and EP2 of the light emitting element LD to advance in a direction (e.g., a front direction) in which an image is displayed.

In an embodiment, since the first and second electrodes REL1 and REL2 have shapes respectively corresponding to those of the first and second banks PW1 and PW2, lights emitted from both the end portions EP1 and EP2 of each of the light emitting elements LD are reflected by the first and second electrodes REL1 and REL2, to further advance in the front direction. Thus, the efficiency of light emitted from the light emitting element LD may be improved.

In an embodiment of the present invention, the first and second banks PW1 and PW2 along with the first and second electrodes REL1 and REL2 provided on the top thereof may serve as reflecting members for improving the efficiency of light emitted from each of the light emitting elements LD.

Any one of the first and second electrodes REL1 and REL2 may be an anode electrode, and the other of the first and second electrodes REL1 and REL2 may be a cathode electrode. In an embodiment of the present invention, the first electrode REL1 may be an anode electrode, and the second electrode REL2 may be a cathode electrode.

The first electrode REL1 and the second electrode REL2 may be disposed on the same plane, and may have the same height. When first electrode REL1 and the second electrode REL2 have the same height, the light emitting element LD may be more stably connected to the first and second electrodes REL1 and REL2.

Although a case in which the first and second electrodes REL1 and REL2 are provided directly on the substrate SUB is illustrated for convenience of description, the present invention is not limited thereto. For example, a component for driving the light emitting device in a passive matrix manner or an active matrix manner may be further provided between the first and second electrodes REL1 and REL2 and the substrate SUB.

When the light emitting device is driven in the active matrix manner, signal lines, an insulating layer, and/or a transistor may be provided between the first and second electrodes REL1 and REL2 and the substrate SUB.

The signal lines may include a scan line, a data line, a power line, and the like. The transistor is connected to the signal lines, and may include a gate electrode, a semiconductor layer, a source electrode, and a drain electrode.

One of the source and drain electrodes of the transistor may be connected to any one of the first and second electrodes REL1 and REL2, and a data signal of the data line may be applied to the one of the first and second electrodes REL1 and REL2 through the transistor. It will be apparent that the signal lines, the insulating layer, and/or the transistor may be provided in various numbers and configurations.

In an embodiment of the present invention, the first electrode REL1 may be connected to the (1-1)th connection line CNL1_1. In an embodiment, the (1-1)th connection line CNL1_1 may be integrally provided with the first electrode REL1.

The (1-1)th connection line CNL1_1 may be electrically connected to the transistor through a contact hole (not shown). Therefore, a signal provided to the transistor may be applied to the first electrode REL1 through the (1-1)th connection line CNL1_1.

The second electrode REL2 may be connected to the (2-1)th connection line CNL2_1. In an embodiment, the (2-1)th connection line CNL2_1 may be integrally provided with the second electrode REL2, and extend along the first direction DR1.

When the light emitting device is driven in the active matrix manner, the (2-1)th connection line CNL2_1 may be electrically connected to the signal line through a contact hole (not shown). Therefore, a voltage of the signal line may be applied to the second electrode REL2 through the (2-1)th connection line CNL2_1. For example, when a second driving voltage VSS is applied to the signal line, the second driving voltage VSS may be applied to the second electrode REL2 through the (2-1)th connection line CNL2_1.

The first and second electrodes REL1 and REL2 and the (1-1)th and (2-1)th connection lines CNL1_1 and CNL2_1 may be made of a conductive material. The conductive material may include a metal such as Ag, Mg, Al, Pt, Pd, Au, Ni, Nd, Ir, Cr, or any alloy thereof, a conductive oxide such as indium tin oxide (ITO), indium zinc oxide (IZO), zinc oxide (ZnO), or indium tin zinc oxide (ITZO), a conductive polymer such as PEDOT, and the like.

Also, the first and second electrodes REL1 and REL2 and the (1-1)th and (2-1)th connection lines CNL1_1 and CNL2_1 may be formed in a single layer. However, the present invention is not limited thereto, and the first and second electrodes REL1 and REL2 and the (1-1)th and (2-1)th connection lines CNL1_1 and CNL2_1 may be formed in a multi-layer in which two or more materials among metals, alloys, conductive oxides, and conductive polymers are stacked.

However, the materials of the first and second electrodes REL1 and REL2 and the (1-1)th and (2-1)th connection lines CNL1_1 and CNL2_1 are not limited to the above-described materials. For example, the first and second electrodes REL1 and REL2 and the (1-1)th and (2-1)th connection lines CNL1_1 and CNL2_1 may be made of a conductive material having a constant reflexibility to allow lights emitted from both the end portions EP1 and EP2 of each of the light emitting elements LD to advance in a direction (e.g., a front direction) in which an image is displayed.

The first contact electrode CNE1 for electrically and/or physically stably connecting the first electrode REL1 and any one of both the end portions EP1 and EP2 of each of the light emitting elements LD may be provided on the first electrode REL1.

The first contact electrode CNE1 may be made of a transparent conductive material such that light emitted from each of the light emitting elements LD and then reflected in the front direction by the first electrode REL1 may advance in the front direction without loss. For example, the transparent conductive material may include any of ITO, IZO, ITZO, and the like. However, the material of the first contact electrode CNE1 is not limited to the above-described materials.

When viewed on a plane, the first contact electrode CNE1 may cover the first electrode REL1 and overlap with the first electrode REL1. Also, the first contact electrode CNE1 may partially overlap with one of both the end portions EP1 and EP2 of each light emitting element LD.

In an embodiment of the present invention, the first contact electrode CNE1 may include a (1-1)th contact electrode CNE1_1 provided on the (1-1)th electrode REL1_1 and a (1-2)th contact electrode CNE1_2 provided on the (1-2)th electrode REL1_2.

When viewed on a plane, the (1-1)th contact electrode CNE1_1 may overlap with the first end portion EP1 of the first light emitting element LD1 and the (1-1)th electrode REL1_1. Also, when viewed on a plane, the (1-2)th contact electrode CNE1_2 may overlap with the second end portion EP2 of the second light emitting element LD2 and the (1-2)th electrode REL1_2.

A third insulating layer INS3 covering the first contact electrode CNE1 may be provided over the first contact electrode CNE1. The third insulating layer INS3 allows the first contact electrode CNE1 not to be exposed to the outside, such that corrosion of the first contact electrode CNE1 may be prevented or substantially prevented.

The third insulating layer INS3 may be an inorganic insulating layer including an inorganic material or an organic insulating layer including an organic material. The third insulating layer INS3 may be provided in a single layer as shown in the drawing. However, the present invention is not limited thereto, and the third insulating layer INS3 may be provided in a multi-layer.

In an embodiment, when the third insulating layer INS3 is provided in the multi-layer, the third insulating layer INS3 may have a structure in which a plurality of inorganic insulating layers and a plurality of organic insulating layers are alternately stacked. For example, the third insulating layer INS3 may have a structure in which a first inorganic insulating layer, an organic insulating layer, and a second inorganic insulating layer are sequentially stacked.

The second contact electrode CNE2 may be provided on the second electrode REL2. When viewed on a plane, the second contact electrode CNE2 may cover the second electrode REL2 and overlap with the second electrode REL2. Also, the second contact electrode CNE2 may overlap with each of the second end portion EP2 of the first light emitting element LD1 and the first end portion EP1 of the second light emitting element LD2.

The second contact electrode CNE2 may be made of the same material as the first contact electrode CNE1, but the present invention is not limited thereto.

A fourth insulating layer INS4 covering the second contact electrode CNE2 may be provided over the second contact electrode CNE2.

The fourth insulating layer INS4 allows the second contact electrode CNE2 not to be exposed to the outside, such that corrosion of the second contact electrode CNE2 may be prevented or substantially prevented. The fourth insulating layer INS4 may be configured as any one of an inorganic insulating layer and an organic insulating layer.

In an embodiment, an overcoat layer OC may be provided on the fourth insulating layer INS4.

The overcoat layer OC may be a planarization layer for reducing a step difference generated by the first and second banks PW1 and PW2, the first and second electrodes REL1 and REL2, the first and second contact electrodes CNE1 and CNE2, and the like, which are disposed on the bottom thereof. Also, the overcoat layer OC may be an encapsulation layer for preventing or substantially preventing oxygen, moisture, and the like from penetrating into the light emitting elements LD.

In some embodiments, the overcoat layer OC may be omitted. When the overcoat layer OC is omitted, the fourth insulating layer INS4 may serve as an encapsulation layer for preventing or substantially preventing oxygen, moisture, and the like from penetrating into the light emitting elements LD.

As described above, the first end portion EP1 of the first light emitting element LD1 may be connected to the (1-1)th electrode REL1_1, and the second end portion EP2 of the first light emitting element LD1 may be connected to one side of the second electrode REL2. For example, the first semiconductor layer 11 of the first light emitting element LD1 may be connected to the (1-1)th electrode REL1_1, and the second semiconductor layer 13 of the first light emitting element LD1 may be connected to one side of the second electrode REL2.

Accordingly, the first and second semiconductor layers 11 and 13 of the first light emitting element LD1 can be applied with a voltage (e.g., a predetermined voltage) through the (1-1)th electrode REL1_1 and the second electrode REL2. When an electric field having a predetermined voltage or more is applied to both the end portions EP1 and EP2 of the first light emitting element LD1, the first light emitting element LD1 emits light while electron-hole pairs are being combined in the active layer 12.

In addition, the first end portion EP1 of the second light emitting element LD2 may be connected to the other side of the second electrode REL2, and the second end portion EP2 of the second light emitting element LD2 may be connected to the (1-2)th electrode REL1_2. For example, the first semiconductor layer 11 of the second light emitting element LD2 may be connected to the (1-2)th electrode REL1_2, and the second semiconductor layer 13 of the second light emitting element LD2 may be connected to the other side of the second electrode REL2.

Accordingly, the first and second semiconductor layers 11 and 13 of the second light emitting element LD2 can be applied with a voltage (e.g., a predetermined voltage) through the (1-2)th electrode REL1_2 and the second electrode REL2. When an electric field having a voltage (e.g., a predetermined voltage) or more is applied to both the end portions EP1 and EP2 of the second light emitting element LD2, the second light emitting element LD2 emits light while electron-hole pairs are being combined in the active layer 12.

In an embodiment, each unit light emitting region of the light emitting device may further include a first capping layer CPL1, a second capping layer CPL2, and a conductive pattern CP.

The first capping layer CPL1 may be provided on the first electrode REL1. The first capping layer CPL1 may prevent or substantially prevent damage of the first electrode REL1 due to a defect or the like, which may occurs in a fabricating process of the light emitting device, and further reinforce adhesion between the first electrode REL1 and the substrate SUB.

The first capping layer CPL1 may be made of a transparent conductive material, such as IZO, so as to minimize or reduce loss of light emitted from each of the light emitting elements LD and then reflected in the front direction by the first electrode REL1.

In an embodiment of the present invention, the first capping layer CPL1 may include a (1-1)th capping layer CPL1_1 and a (1-2)th capping layer CPL1_2. The (1-1)th capping layer CPL1_1 may be provided on the (1-1)th electrode REL1_1, and the (1-2)th capping layer CPL1_2 may be provided on the (1-2)th electrode REL1_2.

The (1-1)th capping layer CPL1_1 and the (1-2)th capping layer CPL1_2 may be connected to a (1-2)th connection line CNL1_2 extending in the first direction DR1. In an embodiment, the (1-2)th connection line CNL1_2 may be integrally provided with the (1-1)th capping layer CPL1_1 and the (1-2)th capping layer CPL1_2, and include the same material as the (1-1)th capping layer CPL1_1 and the (1-2)th capping layer CPL1_2.

The (1-2)th connection line CNL1_2 may be provided on the (1-1)th connection line CNL1_1, and overlap with the (1-1)th connection line CNL1_1 when viewed on a plane. The (1-1)th connection line CNL1_1 and the (1-2)th connection line CNL1_2 may constitute a first connection line CNL1 in the unit light emitting region.

The second capping layer CPL2 may be provided on the second electrode REL2. The second capping layer CPL2 may prevent or substantially prevent damage of the second electrode REL2 due to a defect or the like, which may occurs in the fabricating process of the light emitting device, and further reinforce adhesion between the second electrode REL2 and the substrate SUB.

In an embodiment, the second capping layer CPL2 may be provided in the same layer with the first capping layer CPL1, and include the same material as the first capping layer CPL1. The second capping layer CPL2 may be connected to a (2-2)th connection line CNL2_2 extending in the first direction DR1. In an embodiment, the (2-2)th connection line CNL2_2 may be integrally provided with the second capping layer CPL2, and include the same material as the second capping layer CPL2.

The (2-2)th connection line CNL2_2 may be provided on the (2-1)th connection line CNL2_1, and overlap with the (2-1)th connection line CNL2_1 when viewed on a plane. The (2-1)th connection line CNL2_1 and the (2-2)th connection line CNL2_2 may constitute a second connection line CNL2 in the unit light emitting region.

In an embodiment, the conductive pattern CP may be provided in a shape surrounding the first and second electrodes REL1 and REL2 in the unit light emitting region.

When viewed on a plane, the conductive pattern CP may partially overlap with the first electrode REL1 and the first contact electrode CNE1.

The conductive pattern CP functions to allow the light emitting elements LD to be aligned in the unit light emitting region. That is, the conductive pattern CP may allow the light emitting elements LD not to be aligned in an unwanted region, e.g., at the outside of the unit light emitting region.

The conductive pattern CP may cancel an electric field generated between two adjacent unit light emitting regions, to allow the light emitting elements LD not to be aligned at the outside of a corresponding unit light emitting region.

The conductive pattern CP may be in a floating state in which it is electrically isolated, but the present invention is not limited thereto.

In an embodiment of the present invention, the conductive pattern CP may be provided on the first electrode REL1 with a first insulating layer INS1 interposed therebetween. The first contact electrode CNE1 may be provided on the conductive pattern CP.

Herein, a structure of the light emitting device according to an embodiment of the present invention will be described along a stacking order with reference to FIGS. 3 and 4.

The first and second banks PW1 and PW2 may be provided on the substrate SUB on which the barrier layer BRL is provided. The first and second banks PW1 and PW2 may be disposed on the barrier layer BRL to be spaced apart from each other at a certain distance.

The first electrode REL1 may be provided on the first bank PW1, and the second electrode REL2 may be provided on the second bank PW2. Each of the first and second electrodes REL1 and REL2 may be provided on the same plane as a corresponding bank, to have a shape corresponding to that of the corresponding bank.

The first capping layer CPL1 may be provided on the first electrode REL1, and the second capping layer CPL2 may be provided on the second electrode REL2.

The first insulating layer INS1 may be provided on the substrate SUB including the first and second capping layers CPL1 and CPL2. The first insulating layer INS1 may overlap with a portion of the first capping layer CPL1, and may be disposed between the substrate SUB and one light emitting element LD.

Herein, for convenience of description, the first insulating layer INS1 disposed between the substrate SUB and the one light emitting element LD may be referred to as an "insulating pattern."

The insulating pattern INS1 may fill in a space between the substrate SUB and the one light emitting element LD, stably support the one light emitting element LD, and prevent or substantially prevent separation of the one light emitting element LD.

The insulating pattern INS1 may cover one end portion of the first capping layer CPL1, and be spaced apart from the first electrode REL1. Also, the insulating pattern INS1 may cover one end portion of the second capping layer CPL2, and be spaced apart from the second electrode REL2.

In an embodiment of the present invention, the first insulating layer INS1 may be an inorganic insulating layer including an inorganic material or an organic insulating layer including an organic material.

The first insulating layer INS1 along the first and second capping layers CPL1 and CPL2 may cover the first and second electrodes REL1 and REL2, thereby protecting the first and second electrodes REL1 and REL2. The first insulating layer INS1 may prevent or substantially prevent damage of the first and second electrodes REL1 and REL2 due to a defect or the like, which may occur in the fabricating process of the light emitting device.

The conductive pattern CP may be provided on the substrate SUB including the first insulating layer INS1. The conductive pattern CP may be provided on the first capping layer CPL1 and the first electrode REL1 with the first insulating layer INS1 interposed therebetween.

The light emitting elements LD may be aligned on the substrate SUB including the conductive pattern CP. The light emitting elements LD may be self-aligned through the electric field formed between the first and second electrodes REL1 and REL2 to be provided on the first insulating pattern INS1 between the first and second electrodes REL1 and REL2.

The second insulating layer INS2 covering portions of the upper surfaces of the light emitting elements LD may be provided on the light emitting elements LD. The second insulating layer INS2 may be an inorganic insulating layer including an inorganic material or an organic insulating layer including an organic material.

The first contact electrode CNE1 may be provided on the substrate SUB on which the second insulating layer INS2 is provided. The first contact electrode CNE1 may cover the first capping layer CPL1, and be electrically connected to the first electrode REL1 through the first capping layer CPL1.

In some embodiments, when the first capping layer CPL1 is omitted, the first contact electrode CNE1 may be provided directly on the first electrode REL1 to be connected directly to the first electrode REL1.

The third insulating layer INS3 may be provided on the substrate SUB on which the first contact electrode CNE1 is provided. The third insulating layer INS3 may be provided on the substrate SUB to cover the first contact electrode CNE1 and the second insulating layer INS2.

The second contact electrode CNE2 may be provided on the substrate SUB on which the third insulating layer INS3 is provided. The second contact electrode CNE2 may cover the second capping layer CPL2, and be connected to the second electrode REL2 through the second capping layer CPL2.

In some embodiments, when the second capping layer CPL2 is omitted, the second contact electrode CNE2 may be provided directly on the second electrode REL2 to be connected directly to the second electrode REL2.

The fourth insulating layer INS4 may be provided on the substrate SUB on which the second contact electrode CNE2 is provided.

The overcoat layer OC may be provided on the fourth insulating layer INS4.

Figure 5:
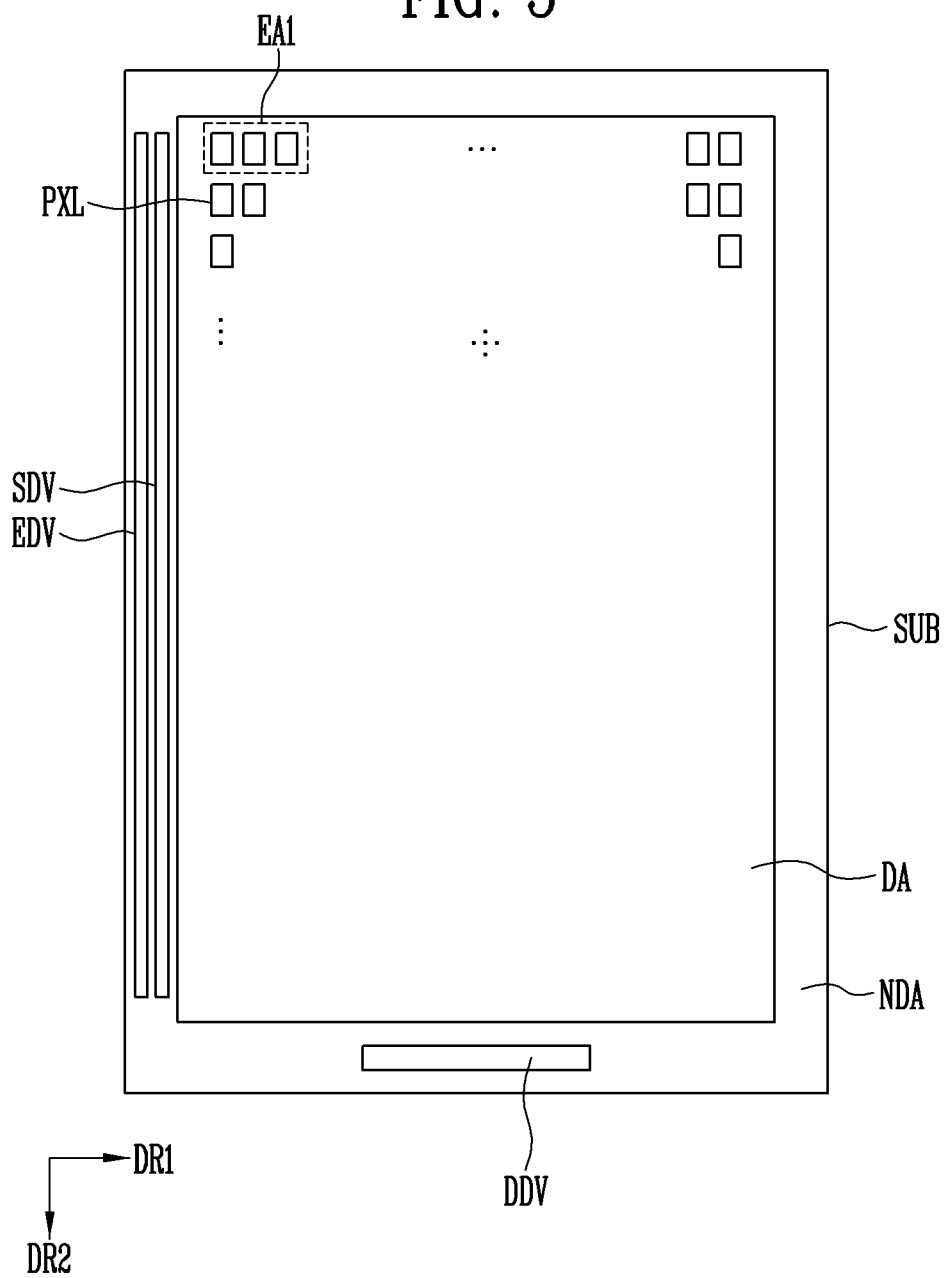
FIG. 5 illustrates a display device according to an embodiment of the present invention, which is a schematic plan view of the display device using the light emitting element shown in FIG. 1 as a light emitting source.

FIG. 5 illustrates a display device according to an embodiment of the present invention, which is a schematic plan view of the display device using the light emitting element shown in FIG. 1 as a light emitting source.

Referring to FIGS. 1 and 5, the display device according to the present invention may include a substrate SUB, pixels PXL provided on the substrate SUB, a driving unit that is provided on the substrate SUB and drives the pixels PXL, and a line unit (not shown) that connects the pixels PXL and the driving unit.

The substrate SUB may include a display region DA and a non-display region NDA.

The display region DA may be a region in which the pixels PXL for displaying an image are provided. The non-display region NDA may be a region in which the driving unit for driving the pixels PXL and a portion of the line unit (not shown) that connects the pixels PXL and the driving unit are provided.

The display region DA may have any of various shapes. For example, the display region DA may be provided in any of various shapes, such as a closed polygon including linear sides, a circle, an ellipse, etc., including curved sides, and a semicircle, a semi-ellipse, etc., including linear and curved sides.

When the display region DA includes a plurality of regions, each region may also be provided in any of various shapes, such as a closed polygon including linear sides, a circle, an ellipse, etc., including curved sides, and a semicircle, a semi-ellipse, etc., including linear and curved sides. In addition, the areas of the plurality of regions may be the same or different from one another.

In an embodiment of the present invention, a case in which the display region DA is provided as one region having a quadrangular shape including linear sides is described as an example.

The non-display area NDA may be provided at at least one side of the display area DA. In an embodiment of the present invention, the non-display area NDA may surround the circumference of the display region DA.

The pixels PXL may be provided in the display region DA on the substrate SUB. Each of the pixels PXL is a minimum unit for displaying an image, and may be provided in plurality.

Each pixel PXL may emit light of any color among red, green, and blue, but the present invention is not limited thereto. For example, the pixel PXL may emit light of any color among cyan, magenta, yellow, and white.

The pixel PXL may be provided in plurality to be arranged in a matrix form along rows extending in a first direction DR1 and columns extending in a second direction DR2 intersecting the first direction DR1. However, the arrangement form of the pixels PXL is not particularly limited, and the pixels PXL may be arranged in any of various forms.

The driving unit provides a signal to each pixel PXL through the line unit, and accordingly, the driving of the pixel PXL can be controlled. In FIG. 5, the line unit is omitted for convenience of description.

The drive unit may include a scan driver SDV for providing a scan signal to the pixels PXL through scan lines, an emission driver EDV for providing an emission control signal to the pixels PXL through emission control lines, a data driver DDV for providing a data signal to the pixels PXL through data lines, and a timing controller (not shown). The timing controller may control the scan driver SDV, the emission driver EDV, and the data driver DDV.

Figure 6:
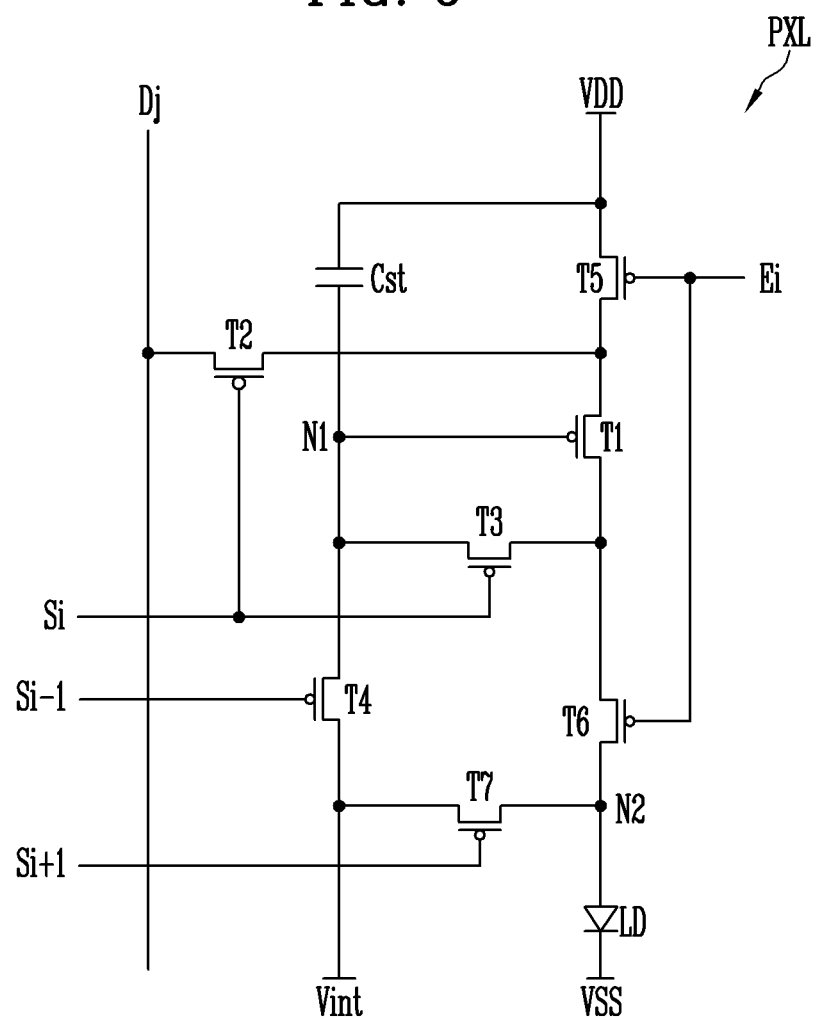
FIG. 6 is an equivalent circuit diagram illustrating one pixel among pixels shown in FIG. 5.

FIG. 6 is an equivalent circuit diagram illustrating one pixel among pixels shown in FIG. 5. In FIG. 6, a pixel connected to a jth data line Dj, an (i−1)th scan line Si−1, an ith scan line Si, and an (i+1)th scan line Si+1 is illustrated for convenience of description.

Referring to FIGS. 5 and 6, the pixel PXL according to an embodiment of the present invention may include a light emitting element LD, first to seventh transistors T1 to T7, and a storage capacitor Cst.

One end portion of the light emitting element LD is connected to the first transistor T1 via the sixth transistor T6, and the other end portion of the light emitting element LD is connected to a second driving voltage VSS. The light emitting element LD may generate light with a luminance (e.g., a predetermined luminance) corresponding to an amount of current supplied from the first transistor T1.

A source electrode of the first transistor (driving transistor) T1 is connected to a first driving voltage VDD via the fifth transistor T5, and a drain electrode of the first transistor T1 is connected to the one end portion of the light emitting element LD via the sixth transistor T6. The first transistor T1 controls an amount of current flowing from the first driving voltage VDD to the second driving voltage VSS via the light emitting element LD, corresponding to a voltage of a first node N1 that is a gate electrode thereof.

The second transistor (switching transistor) T2 is connected between a jth data line Dj and the source electrode of the first transistor T1. In addition, a gate electrode of the second transistor T2 is connected to an ith scan line Si. The second transistor T2 is turned on when a scan signal is supplied to the ith scan line Si, to electrically connect the jth data line Dj and the source electrode of the first transistor T1.

The third transistor T3 is connected between the drain electrode of the first transistor T1 and the first node N1. In addition, a gate electrode of the third transistor T3 is connected to the ith scan line Si. The third transistor T3 is turned on when a scan signal is supplied to the ith scan line Si, to electrically connect the drain electrode of the first transistor T1 and the first node N1. Therefore, the first transistor T1 is diode-connected when the third transistor T3 is turned on.

The fourth transistor T4 is connected between the first node N1 and an initialization power source Vint. In addition, a gate electrode of the fourth transistor T4 is connected to the (i−1)th scan line Si−1. The fourth transistor T4 is turned on when a scan signal is supplied to the (i−1)th scan line Si−1, to supply the voltage of the initialization power source Vint to the first node N1. The initialization power source Vint is set to a voltage lower than a data signal.

The fifth transistor T5 is connected between the first driving voltage VDD and the source electrode of the first transistor T1. In addition, a gate electrode of the fifth transistor T5 is connected to an ith emission control line Ei. The fifth transistor T5 is turned off when an emission control signal is supplied to the ith emission control line Ei, and is turned on otherwise.

The sixth transistor T6 is connected between the drain electrode of the first transistor T1 and the one end portion of the light emitting element LD. In addition, a gate electrode of the sixth transistor T6 is connected to the ith emission control line Ei. The sixth transistor T6 is turned off when an emission control signal is supplied to the ith emission control line Ei, and is turned on otherwise.

The seventh transistor T7 is connected between the initialization power source Vint and the one end portion of the light emitting element LD. In addition, a gate electrode of the seventh transistor T7 is connected to an (i+1)th scan line Si+1. The seventh transistor T7 is turned on when a scan signal is supplied to the (i+1)th scan line Si+1, to supply the voltage of the initialization power source Vint to the one end portion of the light emitting element LD.

The storage capacitor Cst is connected between the first driving voltage VDD and the first node N1. The storage capacitor Cst stores a voltage corresponding to the data signal and a threshold voltage of the first transistor T1.

Meanwhile, when the light emitting element LD is aligned in the pixel PXL, a first alignment line (not shown) is connected to a second node N2, and a second alignment line (not shown) is connected to the other end portion of the light emitting element LD.

A ground voltage may be applied to the first alignment line, and an AC voltage may be applied to the second alignment line. When voltages (e.g., predetermined voltages) having different voltage levels are respectively applied to the first and second alignment lines, an electric field may be formed between the second node N2 and the other end portion of the light emitting element LD. The light emitting element LD may be aligned in a desired region in the pixel PXL by the electric field.

Figure 7:
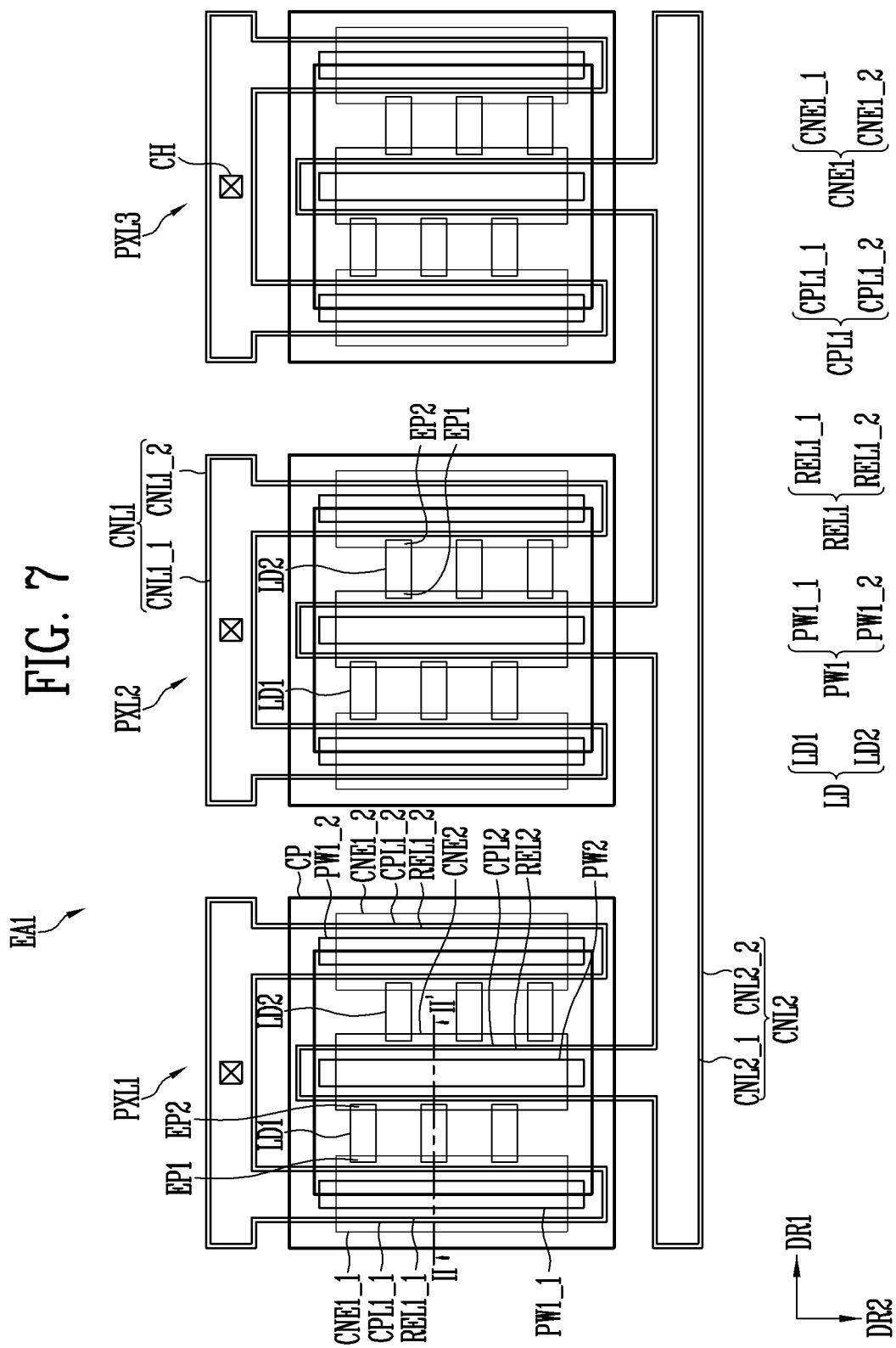
FIG. 7 is an enlarged plane view of a region "EA1" of FIG. 5.
Figure 8:
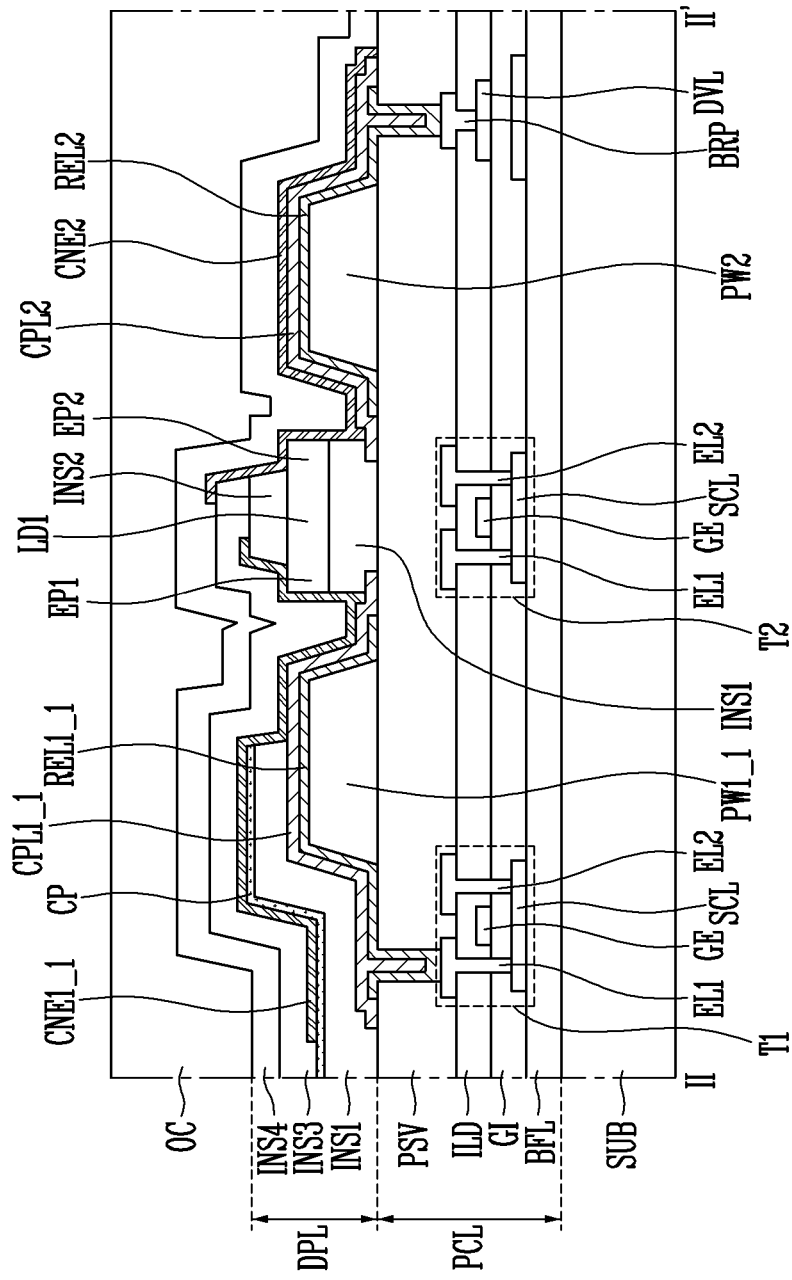
FIG. 8 is a cross-sectional view taken along the line II-II' of FIG. 7.
Figure 9A:
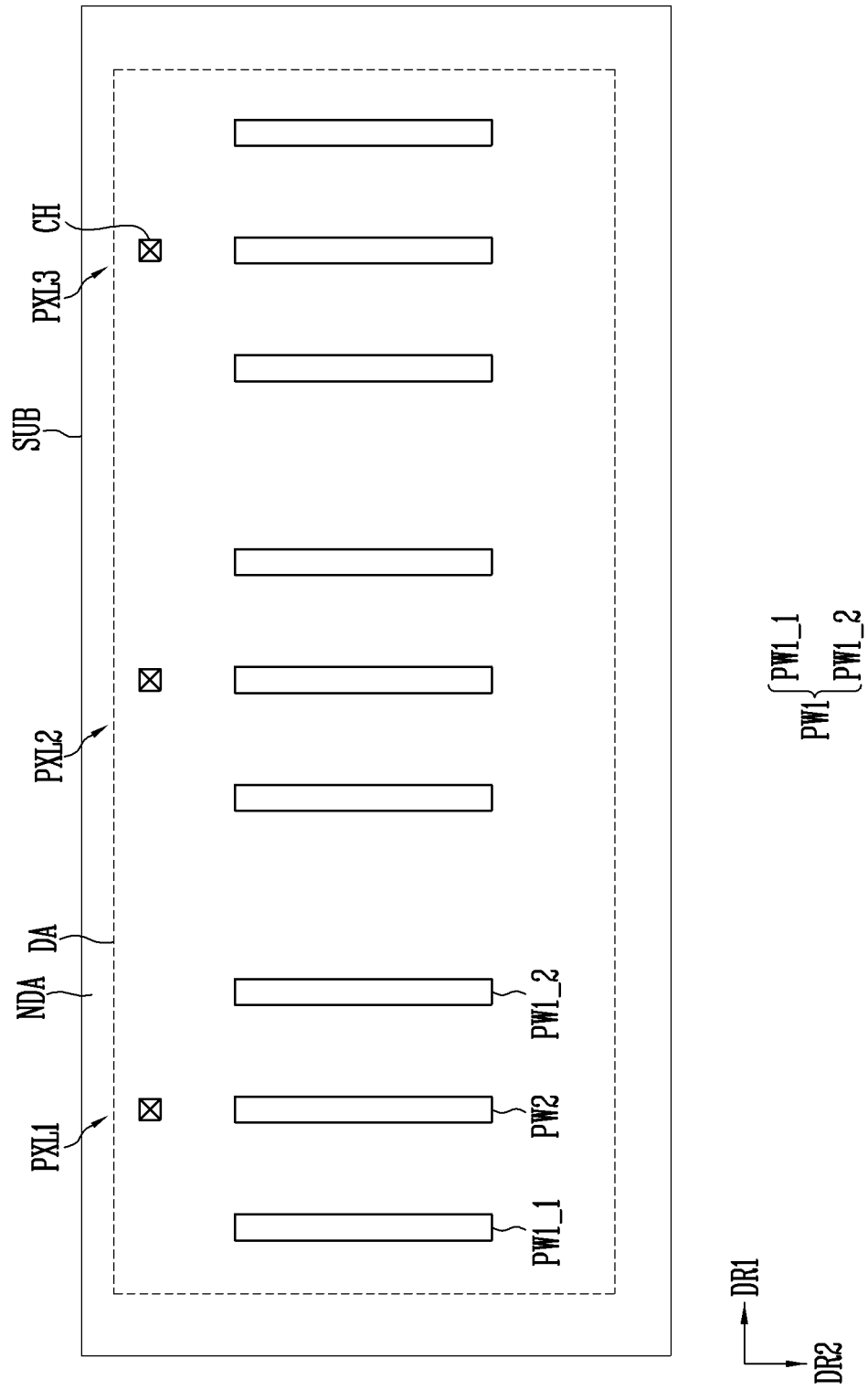
Figure 9B:
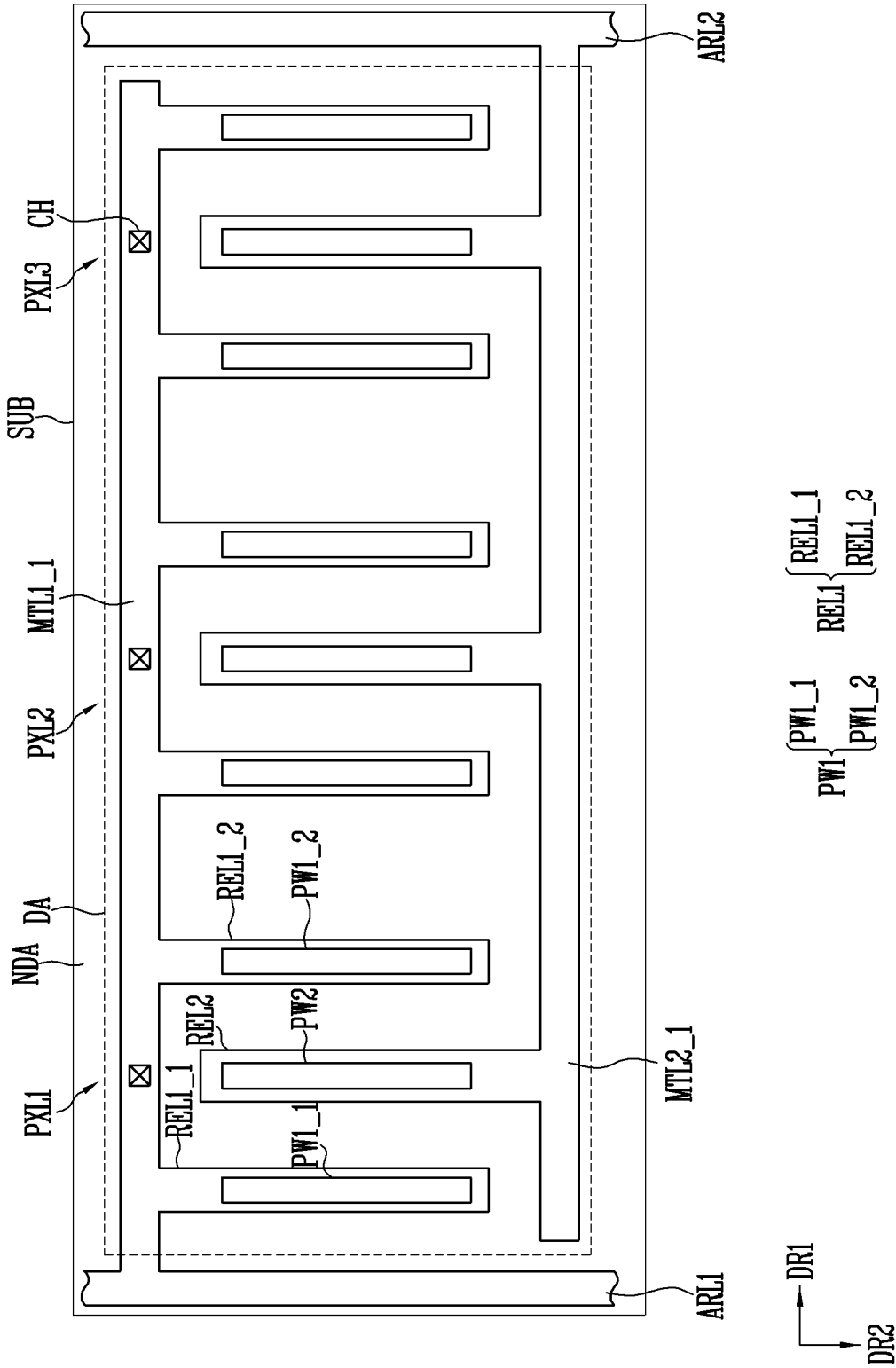
Figure 9C:
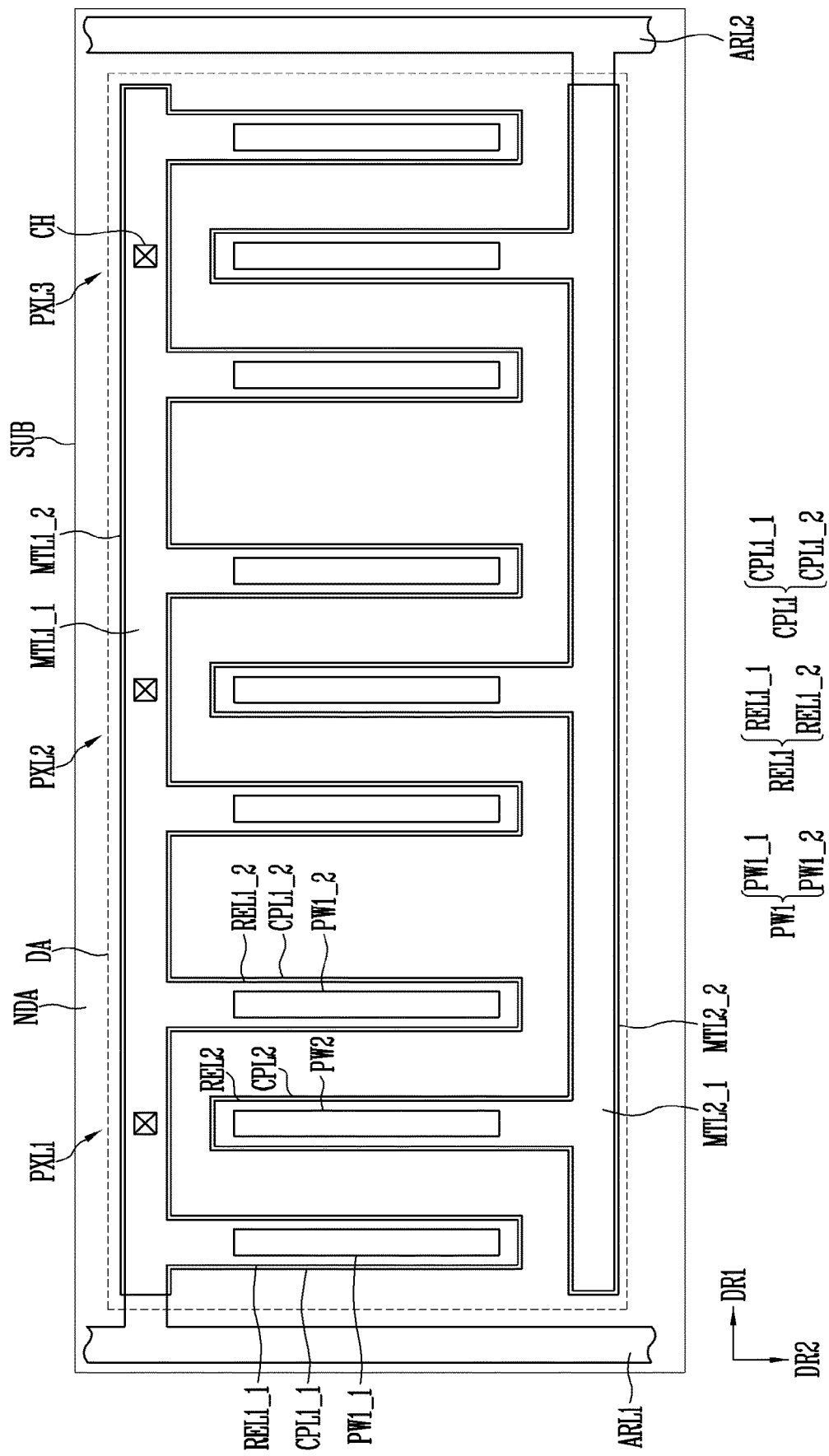
Figure 9D:
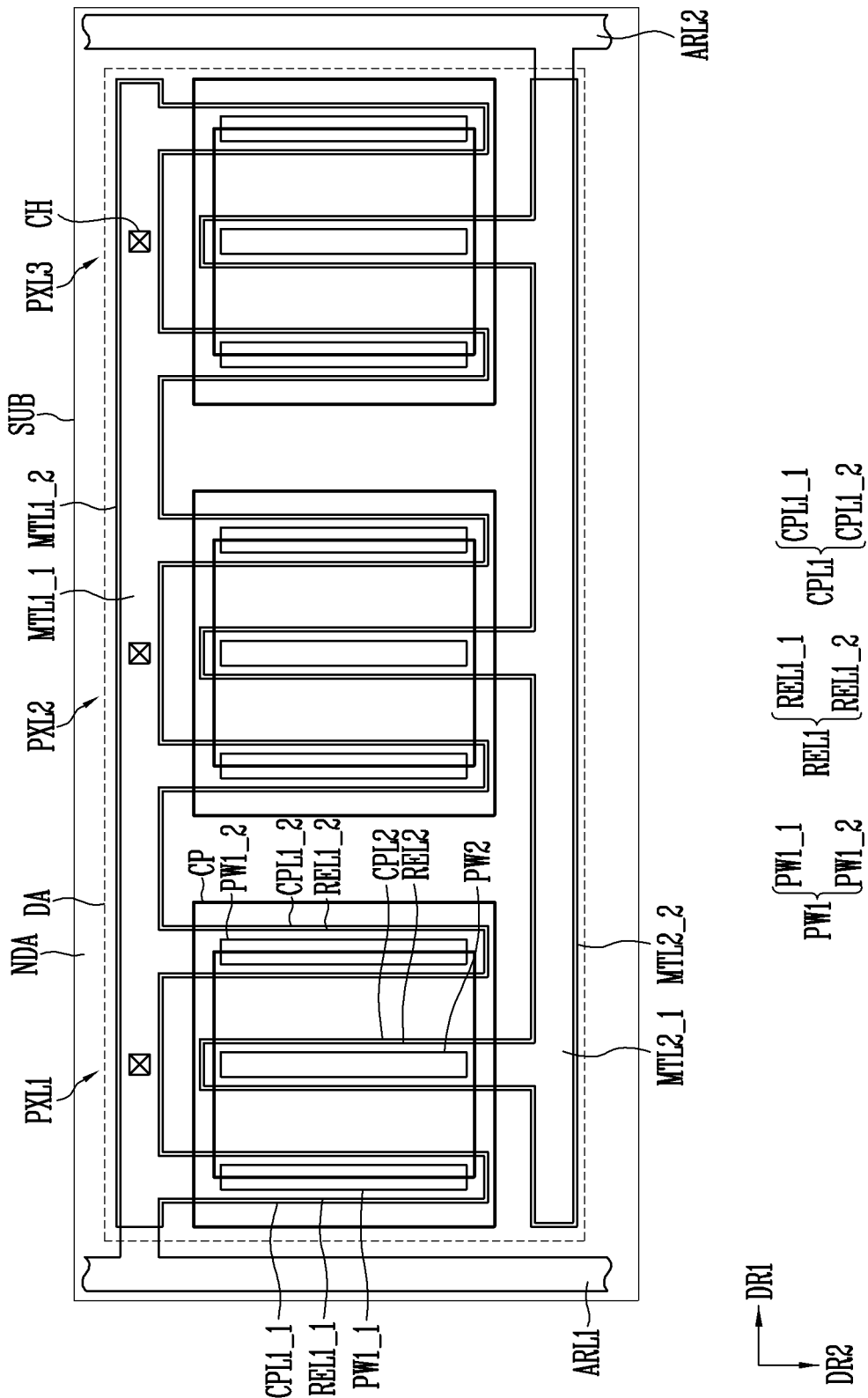
Figure 9F:
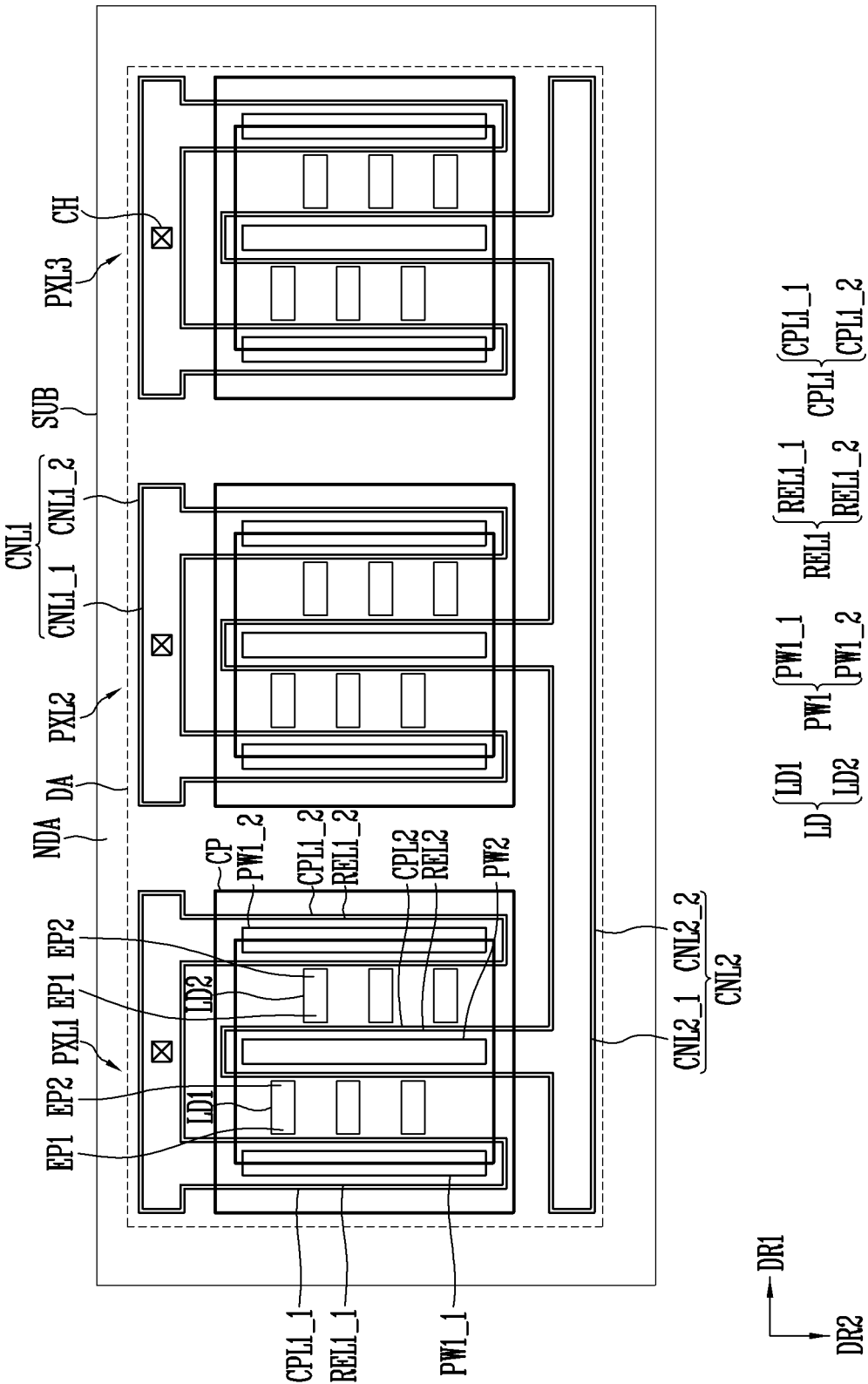
Figure 9H:
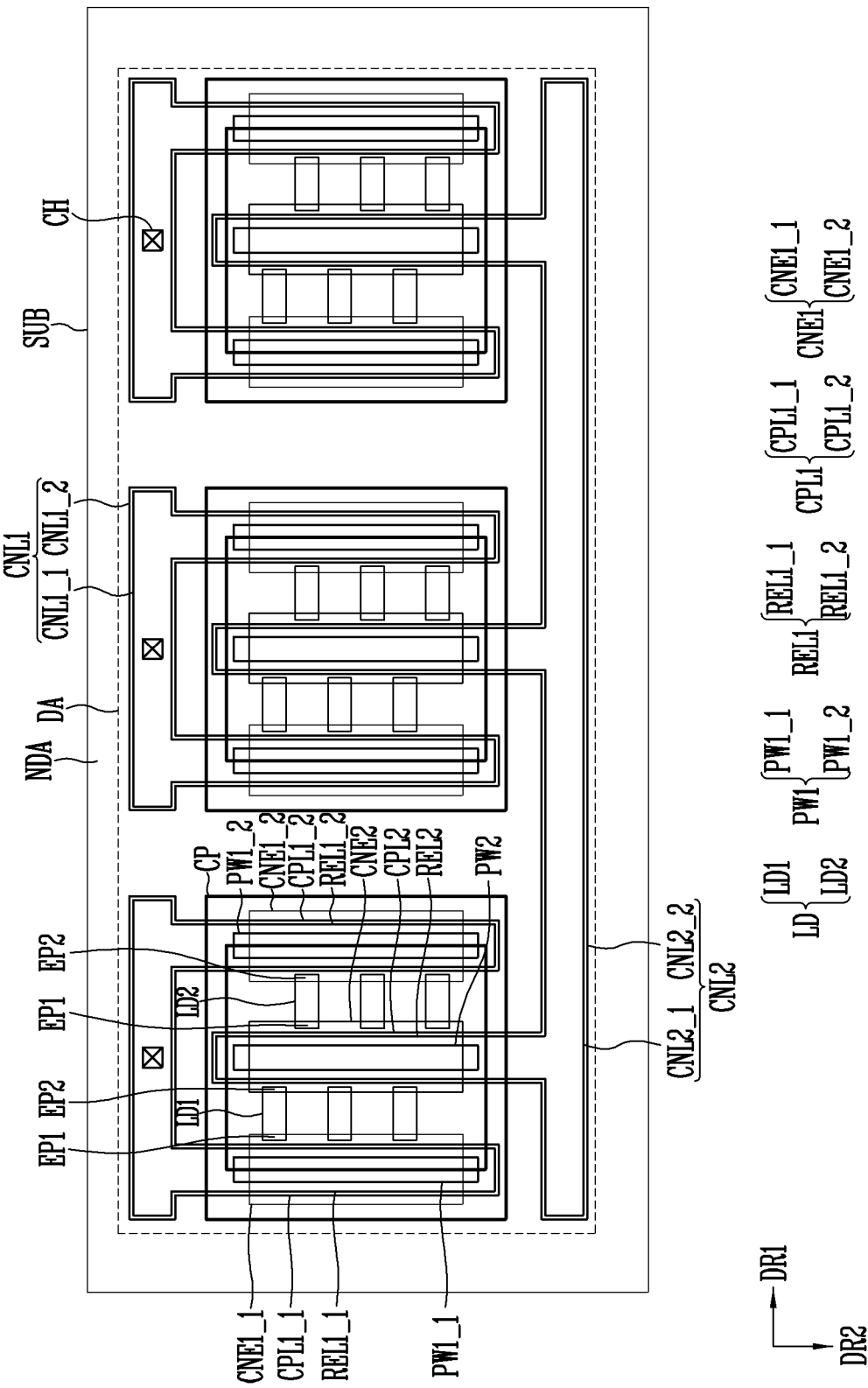
Figure 10A:
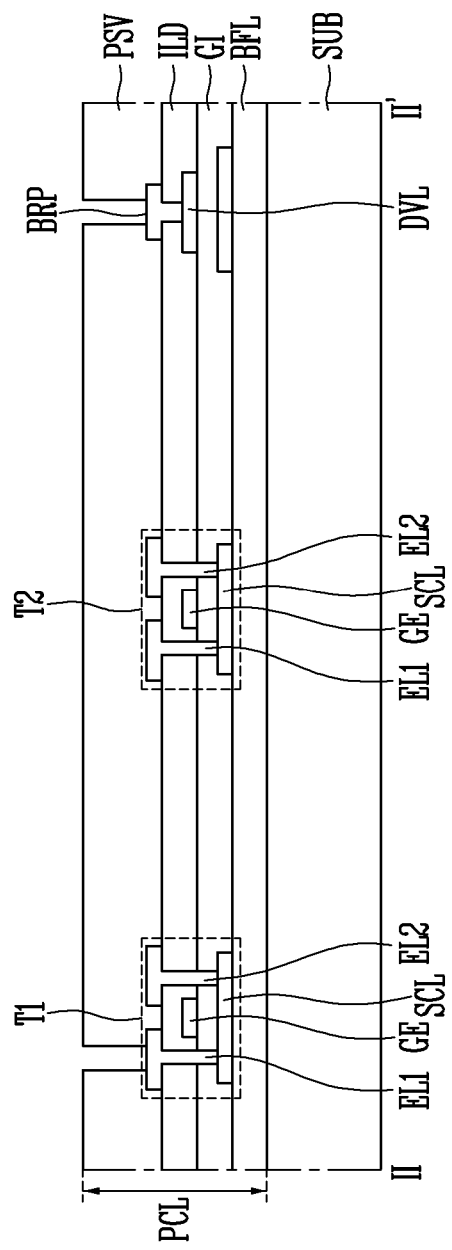
Figure 10B:
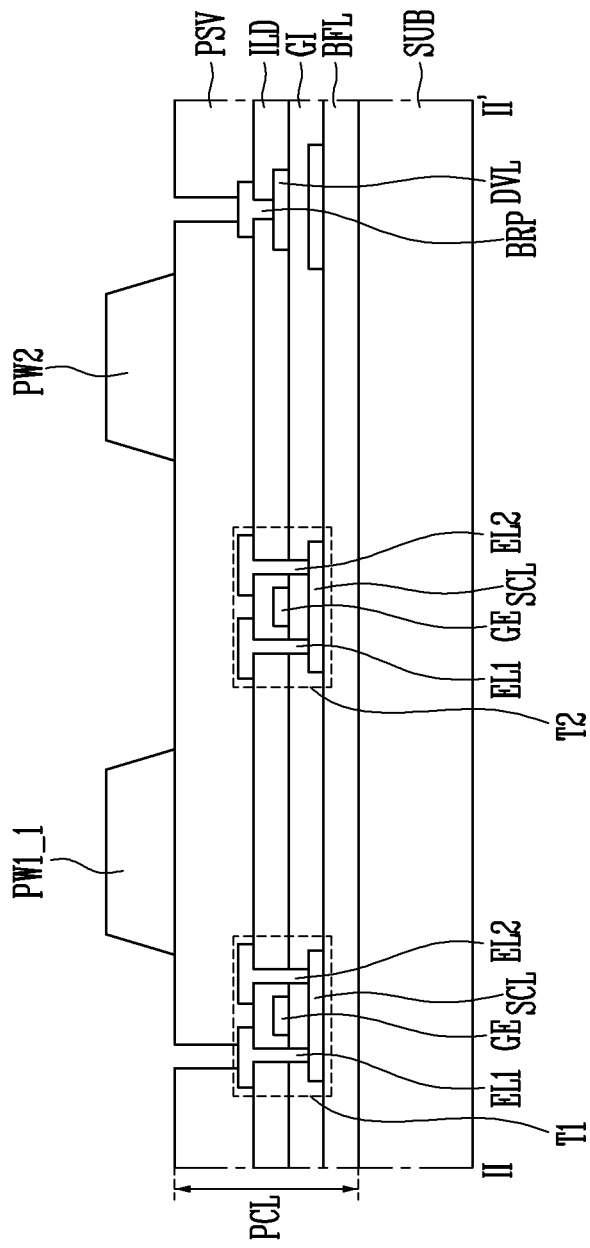
Figure 10D:
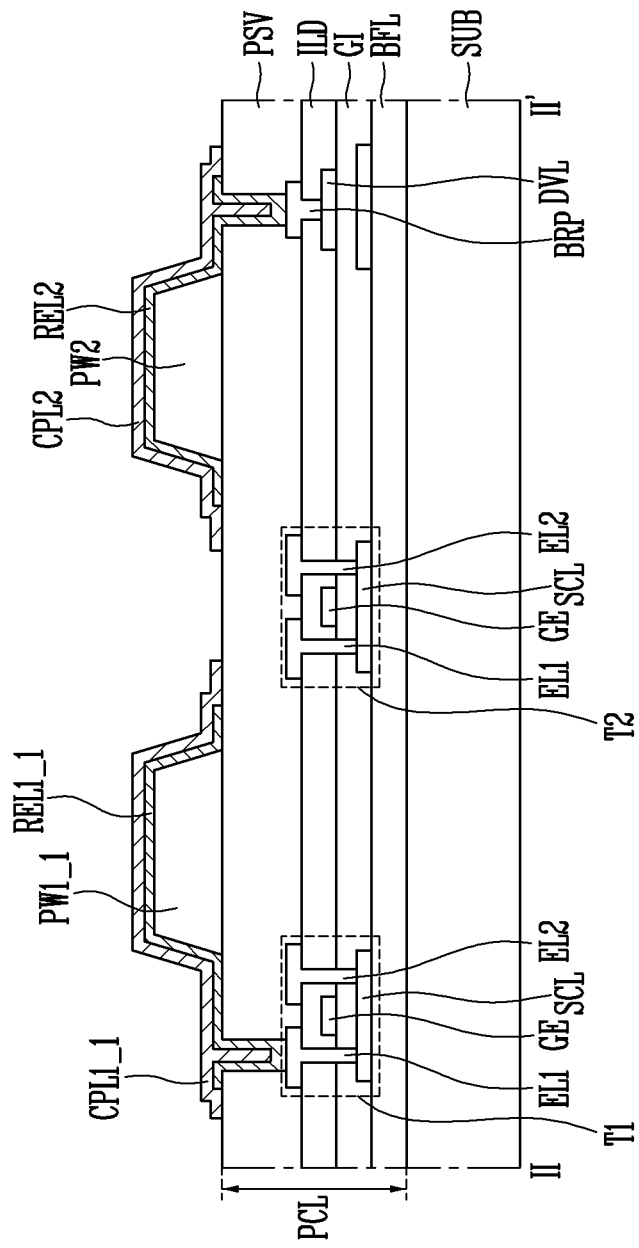
Figure 10E:
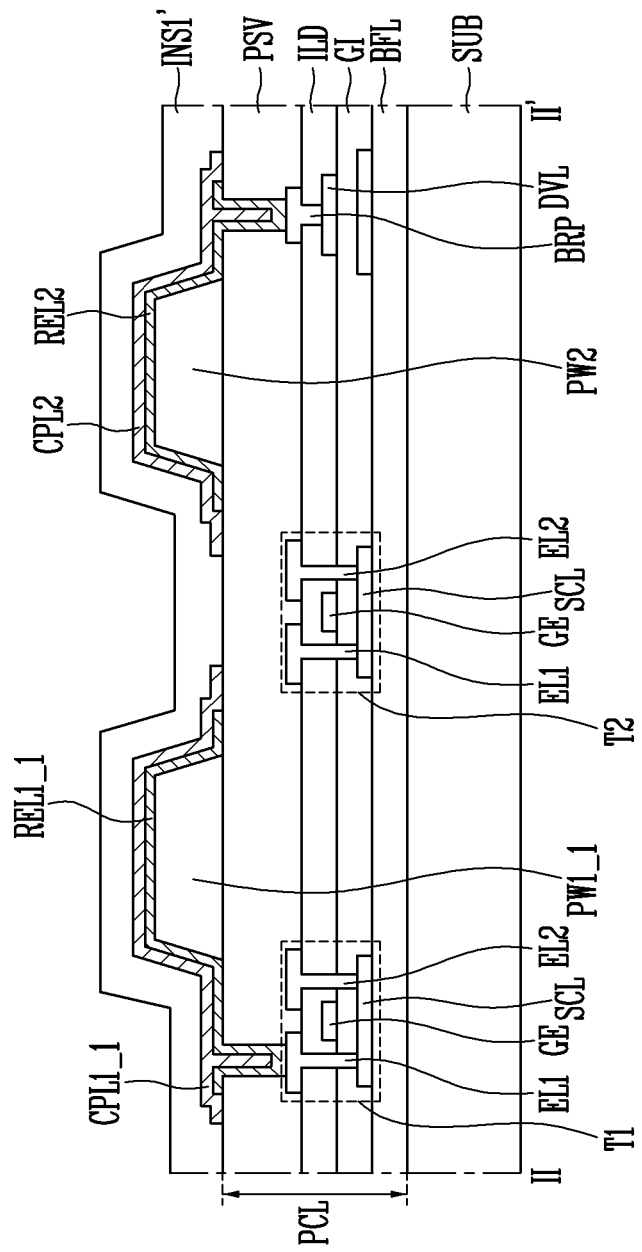
Figure 10F:
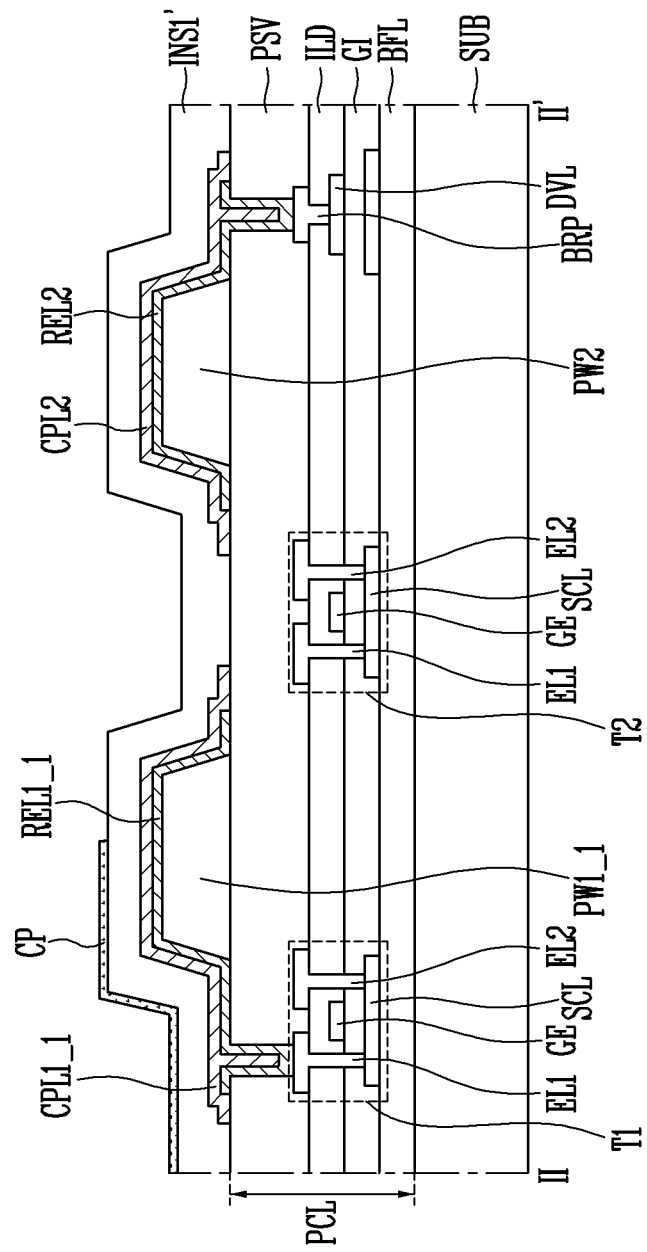
Figure 10G:
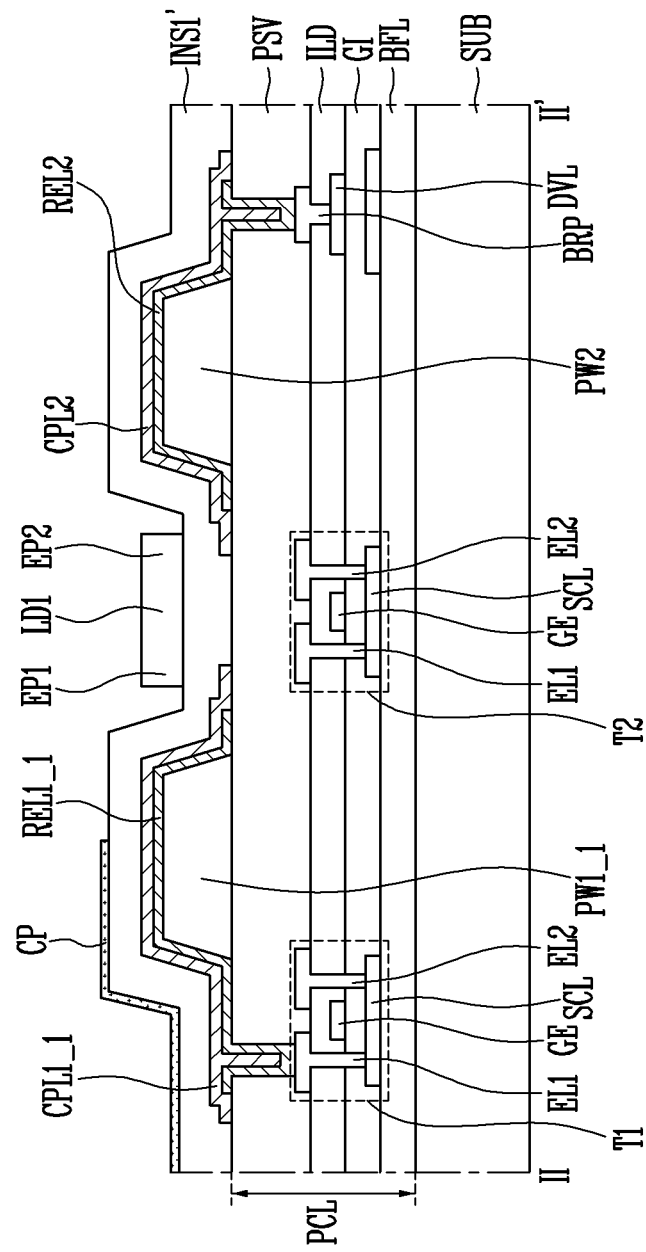
Figure 10H:
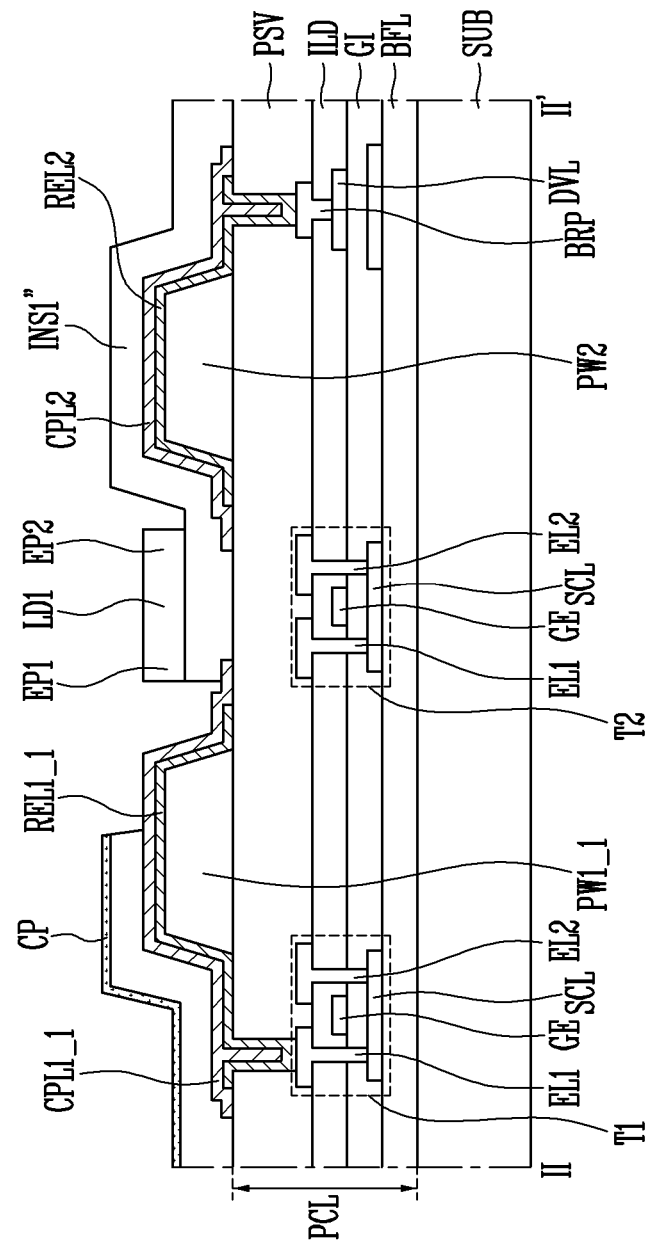
Figure 10I:
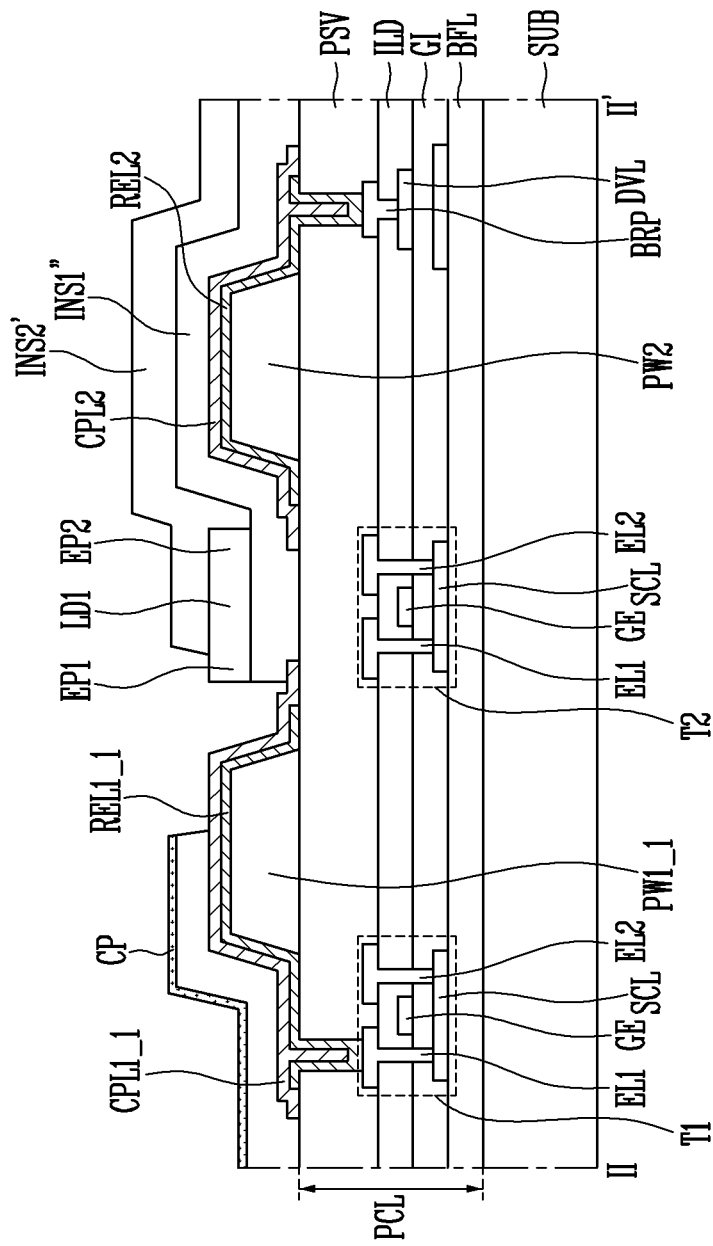
Figure 10J:
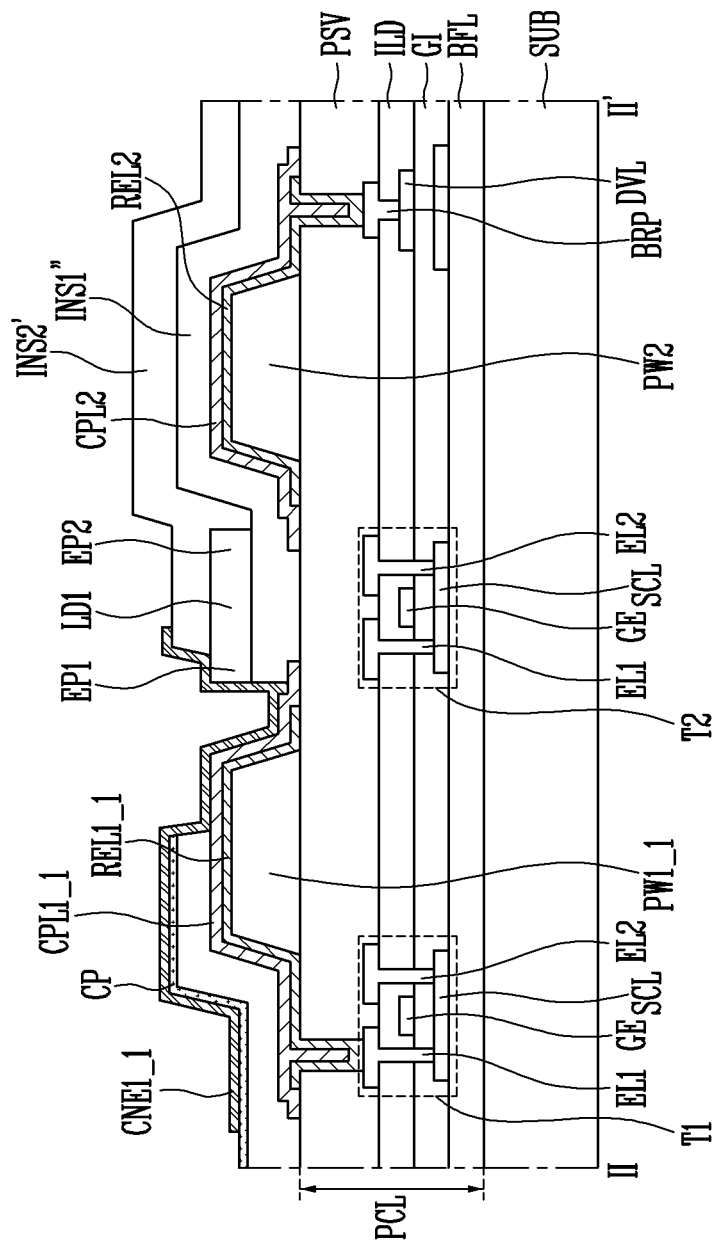
Figure 10K:
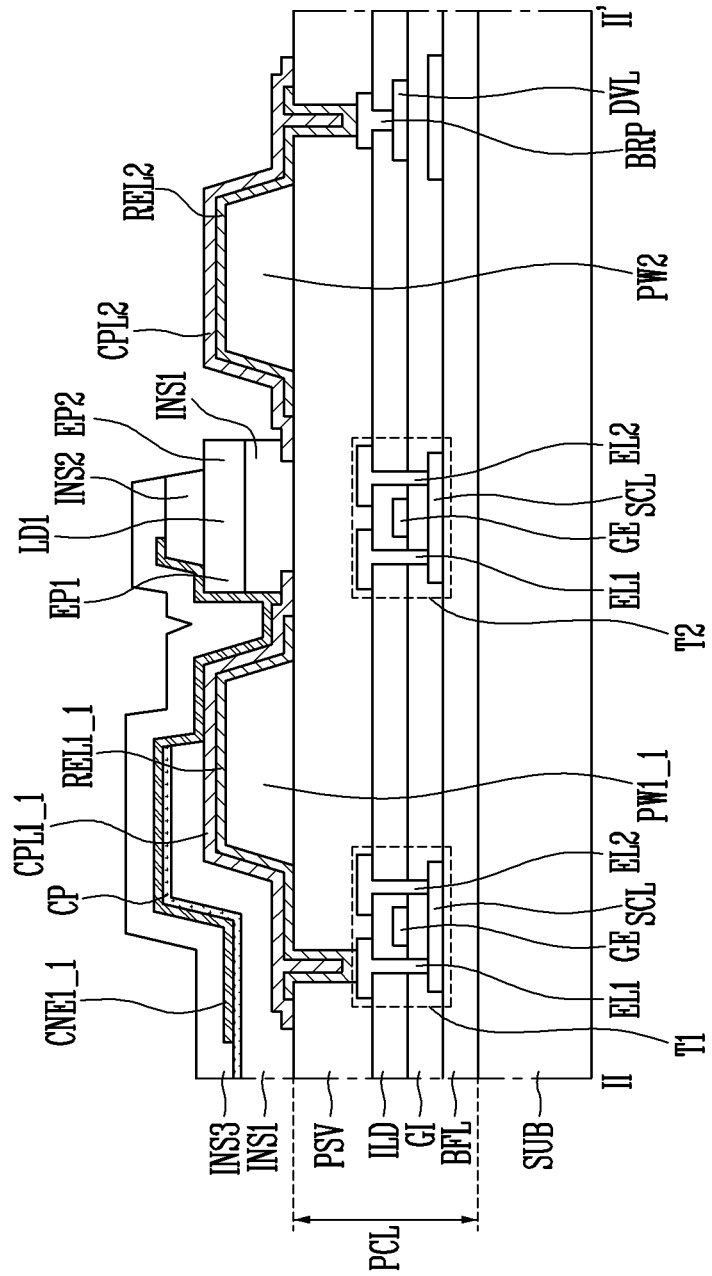
Figure 10L:
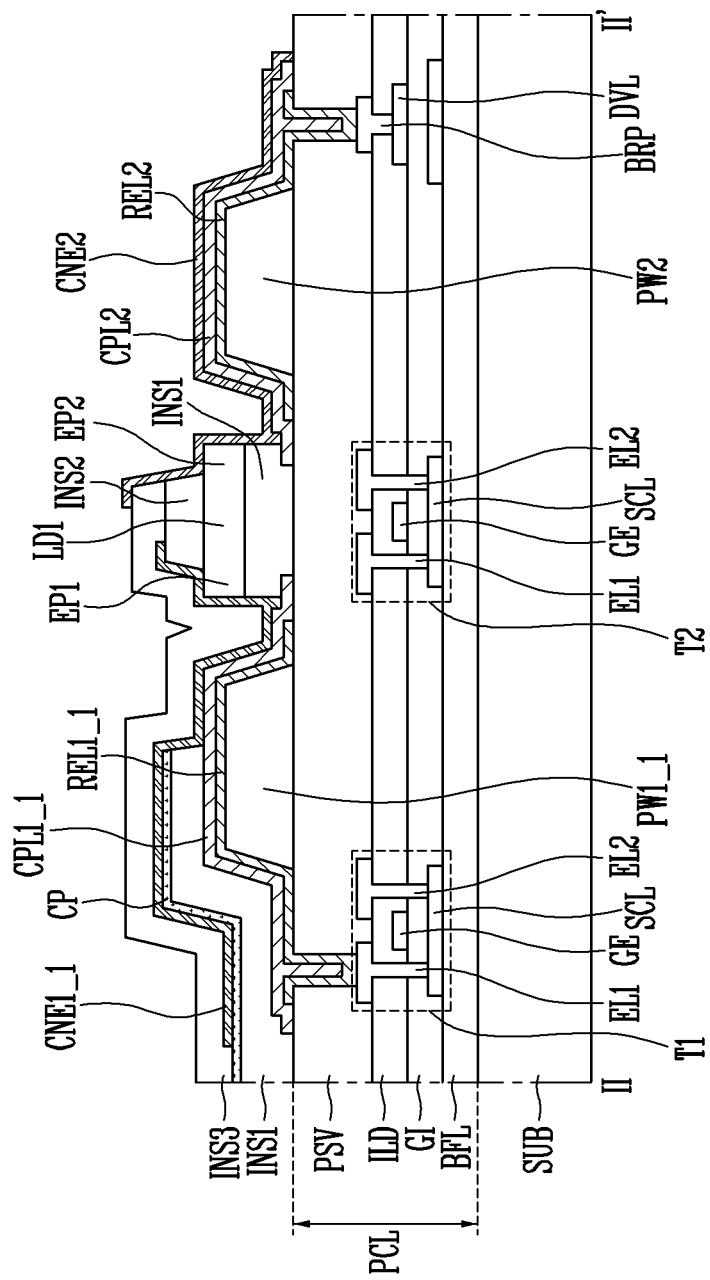
Figure 10M:
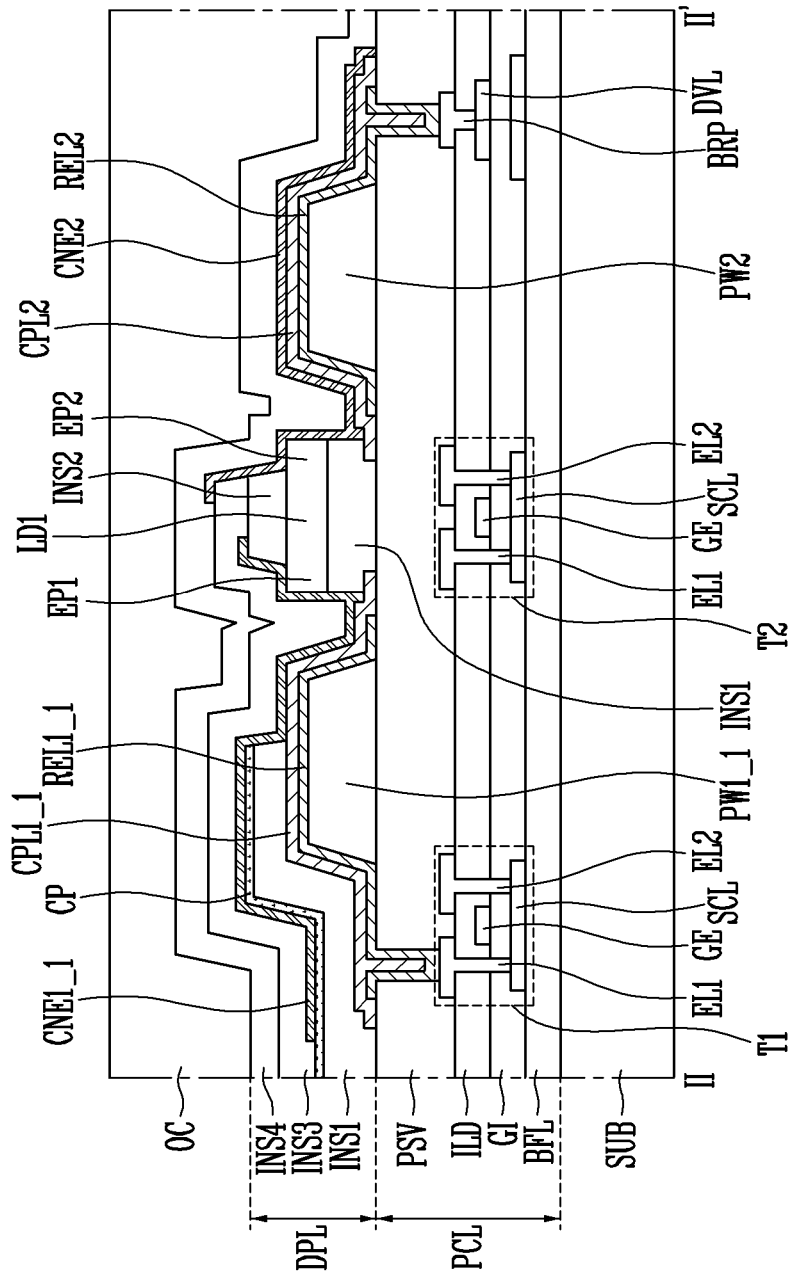

FIG. 7 is an enlarged plane view of a region "EA1" of FIG. 5; and FIG. 8 is a cross-sectional view taken along the line II-II' of FIG. 7.

In FIG. 7, a case where a plurality of light emitting elements are arranged in a horizontal direction is illustrated for convenience of description, but the arrangement of the light emitting elements is not limited thereto.

Also, in FIG. 7, illustration of a transistor connected to the light emitting elements and signal lines connected to the transistor will be omitted for convenience of description.

In the present embodiment, portions different from those of the above-described embodiment will be mainly described to avoid redundancy. Portions not particularly described with respect to the present embodiment follow those of the above-described embodiment. In addition, like reference numerals refer to like components, and similar reference numerals refer to similar components. In FIGS. 7 and 8, a unit light emitting region may be a pixel region provided in one pixel.

Referring to FIGS. 1 to 8, the display device according to an embodiment of the present invention may include a substrate SUB on which first to third pixels PXL1 to PXL3 are provided. Each of the first to third pixels PXL1 to PXL3 is a pixel region in which an image is displayed, and may be a unit light emitting region from which light is emitted.

Each of the first to third pixels PXL1 to PXL3 may include the substrate SUB, a pixel circuit layer PCL provided on the substrate SUB, and a display element layer DPL provided on the pixel circuit layer PCL.

The substrate SUB may include an insulative material such as glass, organic polymer, or quartz. In an embodiment, the substrate SUB may be made of a material having flexibility to be bendable or foldable. The substrate SUB may have a single- or multi-layered structure.

The pixel circuit layer PCL may include a buffer layer BFL disposed on the substrate SUB, first and second transistors T1 and T2 disposed on the buffer layer BFL, and a driving voltage line DVL.

The buffer layer BFL may prevent or substantially prevent an impurity from being diffused into the first and second transistors T1 and T2. In an embodiment, the buffer layer BFL may be provided in a single layer, but be provided in a multi-layer including at least two layers.

When the buffer layer BFL is provided in the multi-layer, the layers may be formed of the same material or may be formed of different materials. In an embodiment, the buffer layer BFL may be omitted according to the material and process conditions of the substrate SUB.

The first transistor T1 may be a driving transistor electrically connected to some of a plurality of light emitting elements LD provided in the display element layer DPL to drive a corresponding light emitting element LD, and the second transistor T2 may be a switching transistor for switching the first transistor T1.

Each of the first and second transistors T1 and T2 may include a semiconductor layer SCL, a gate electrode GE, and first and second terminals EL1 and EL2.

The semiconductor layer SCL may be disposed on the buffer layer BFL. The semiconductor layer SCL may include a first region in contact with the first terminal EL1 and a second region in contact with the second terminal EL2. A region between the first region and the second region may be a channel region. In an embodiment of the present invention, the first region may be one of a source region and a drain region, and the second region may be the other of the source region and the drain region.

The semiconductor layer SCL may be a semiconductor pattern made of poly-silicon, amorphous silicon, oxide semiconductor, etc. The channel region is a semiconductor pattern undoped with an impurity, and may be an intrinsic semiconductor. The first region and the second region are semiconductor patterns doped with the impurity.

The gate electrode GE may be provided on the semiconductor layer SCL with a gate insulating layer GI interposed therebetween.

The first terminal EL1 and the second terminal EL2 may be in contact with the first region and the second region of the semiconductor layer SCL through contact holes penetrating an interlayer insulating layer ILD and the gate insulating layer GI, respectively.

The driving voltage line DVL may be provided on the gate insulating layer GI to be connected to a bridge pattern BRP through a contact hole penetrating the interlayer insulating layer ILD.

A protective layer PSV may be provided over the first and second transistors T1 and T2 and the driving voltage line DVL.

The display element layer DPL of each of the first to third pixels PXL1 to PXL3 may include first and second banks PW1 and PW2, first and second electrodes REL1 and REL2, the light emitting elements LD, and first and second contact electrodes CNE1 and CNE2, which are provided on the protective layer PSV.

The light emitting elements LD may include a first light emitting element LD1 and a second light emitting element LD2. Each of the first and second light emitting elements LD1 and LD2 may include a first semiconductor layer 11, a second semiconductor layer 13, and an active layer 12 interposed between the first and second semiconductor layers 11 and 13. Also, each of the first and second light emitting elements LD1 and LD2 may include a first end portion EP1 and a second end portion EP2 along the length direction thereof.

The first and second end portions EP1 and EP2 of each of the first and second light emitting elements LD1 and LD2 may be exposed to the outside by a second insulating layer INS2 covering a portion of an upper surface of each of the first and second light emitting elements LD1 and LD2.

Each of the first and second light emitting elements LD1 and LD2 may emit colored light and/or white light.

The first and second banks PW1 and PW2 may be spaced apart from each other on the protective layer PSV. In an embodiment, the first and second banks PW1 and PW2 may have a trapezoidal shape of which side surfaces are inclined at an angle (e.g., a predetermined angle), but the present invention is not limited thereto.

When viewed on a plane, the first bank PW1 may include a (1-1)th bank PW1_1 and a (1-2)th bank PW1_2, which are spaced apart from each other at a certain distance with the second bank PW2 interposed therebetween.

The first electrode REL1 may be provided on the first bank PW1, and the second electrode REL2 may be provided on the second bank PW2. The first electrode REL1 may have a shape corresponding to that of the first bank PW1, and the second electrode REL2 may have a shape corresponding to that of the second bank PW2.

The first electrode REL1 may include a (1-1)th electrode REL1_1 provided on the (1-1)th bank PW1_1 and a (1-2)th electrode REL1_2 provided on the (1-2)th bank PW1_2. The (1-1)th electrode REL1_1 and the (1-2)th electrode REL1_2 may be connected to a (1-1)th connection line CNL1_1 extending in a first direction DR1.

The (1-1)th electrode REL1_1 may be disposed adjacent to the first end portion EP1 of the first light emitting element LD1, and the (1-2)th electrode REL1_2 may be disposed adjacent to the second end portion EP2 of the second light emitting element LD2. When viewed on a plane, the (1-1)th electrode REL1_1 and the (1-2)th electrode REL1_2 may be spaced apart from each other at a certain distance with the second electrode REL2 interposed therebetween.

The second electrode REL2 may be provided on the second bank PW2, and be disposed between the first light emitting element LD1 and the second light emitting element LD2 when viewed on a plane.

One side of the second electrode REL2 may be disposed adjacent to the second end portion EP2 of the first light emitting element LD1, and the other side of the second electrode REL2 may be disposed adjacent to the first end portion EP1 of the second light emitting element LD2.

The second electrode REL2 may be connected to a (2-1)th connection line CNL2_1 extending in the first direction DR1.

In an embodiment of the present invention, the (1-1)th connection line CNL1_1 may be a line for applying a voltage to the first electrode REL1 in alignment of a corresponding light emitting element LD. The (2-1)th connection line CNL2_1 may be a line for applying a voltage to the second electrode REL2 in alignment of a corresponding light emitting element LD.

In an embodiment of the present invention, the first electrode REL1 and the (1-1)th connection line CNL1_1 may be integrally provided, and the second electrode REL2 and the (2-1)th connection line CNL2_1 may be integrally provided.

The first contact electrode CNE1 for electrically and/or physically stably connecting the first electrode REL1 and the light emitting elements LD may be provided on the first electrode REL1.

The first contact electrode CNE1 may include a (1-1)th contact electrode CNE1_1 provided on the (1-1)th electrode REL1_1 and a (1-2)th contact electrode CNE1_2 provided on the (1-2)th electrode REL1_2.

The (1-1)th contact electrode CNE1_1 may be in ohmic contact with each of the first end portion EP1 of the first light emitting element LD1 and the (1-1)th electrode REL1_1. The (1-2)th contact electrode CNE1_2 may be in ohmic contact with each of the second end portion EP2 of the second light emitting element LD2 and the (1-2)th electrode REL1_2.

A third insulating layer INS3 may be provided over the first contact electrode CNE1. The third insulating layer INS3 may cover the first contact electrode CNE1 disposed on the bottom thereof not to be exposed to the outside.

The second contact electrode CNE2 for electrically and/or physically stably connecting the second electrode REL2 and the first and second light emitting elements LD1 and LD2 may be provided on the second electrode REL2.

One side of the second contact electrode CNE2 may be in ohmic contact with each of the one side of the second electrode REL2 and the second end portion EP2 of the first light emitting element LD1. The other side of the second contact electrode CNE2 may be in ohmic contact with each of the other side of the second electrode REL2 and the first end portion EP1 of the second light emitting element LD2.

A fourth insulating layer INS4 may be provided over the second contact electrode CNE2. The fourth insulating layer INS4 may cover the second contact electrode CNE2 disposed on the bottom thereof not to be exposed to the outside.

An overcoat layer OC may be provided on the fourth insulating layer INS4.

Meanwhile, the display element layer DPL of each of the first to third pixels PXL1 to PXL3 may further include a first capping layer CPL1, a second capping layer CPL2, and a conductive pattern CP.

The first capping layer CPL1 may be provided on the first electrode REL1. The first capping layer CPL1 may include a (1-1)th capping layer CPL1_1 provided on the (1-1)th electrode REL1_1 and a (1-2)th capping layer CPL1_2 provided on the (1-2)th electrode REL1_2.

The (1-1)th capping layer CPL1_1 and the (1-2)th capping layer CPL1_2 may be connected to a (1-2)th connection line CNL1_2 extending in the first direction DR1.

The (1-2)th connection line CNL1_2 may be provided on the (1-1)th connection line CNL1_1, and overlap with the (1-1)th connection line CNL1_1 when viewed on a plane. Therefore, the (1-2)th connection line CNL1_2 along with the (1-1)th connection line CNL1_1 may constitute a first connection line CNL1 of each of the first to third pixels PXL1 to PXL3.

The first connection line CNL1 may be electrically connected to the pixel circuit layer PCL of each of the first to third pixels PXL1 to PXL3 through a contact hole CH.

The second capping layer CPL2 may be provided on the second electrode REL2. The second capping layer CPL2 may be connected to a (2-2)th connection line CNL2_2 extending in the first direction DR1.

The (2-2)th connection line CNL2_2 may be provided on the (2-1)th connection line CNL2_1, and overlap with the (2-1)th connection line CNL2_1 when viewed on a plane. Therefore, the (2-2)th connection line CNL2_2 along with the (2-1)th connection line CNL2_1 may constitute a second connection line CNL2.

The conductive pattern CP may be provided in a shape surrounding the first and second electrodes REL1 and REL2 in a unit light emitting region of each of the first to third pixels PXL1 to PXL3.

The conductive pattern CP of each of the first to third pixels PXL1 to PXL3 functions to allow the light emitting elements LD to be aligned in the unit light emitting region of corresponding pixel PXL. That is, the conductive pattern CP of each of the first to third pixels PXL1 to PXL3 may allow the light emitting elements LD not to be aligned at the outside of the unit light emitting region of a corresponding pixel PXL.

For example, the conductive pattern CP of the second pixel PXL2 may cancel an electric field generated between the (1-1)th electrode REL1_1 of the second pixel PXL2 and the (1-2)th electrode REL1_2 of the first pixel PXL1 adjacent to the second pixel PXL2. Therefore, the light emitting elements LD may not be aligned between the first pixel PXL1 and the second pixel PXL2.

Also, the conductive pattern CP of the second pixel PXL2 may cancel an electric field generated between the (1-2)th electrode REL1_2 of the second pixel PXL2 and the (1-1)th electrode REL1_1 of the third pixel PXL3 adjacent to the second pixel PXL2. Therefore, the light emitting elements LD may not be aligned between the second pixel PXL2 and the third pixel PXL3.

The conductive pattern CP of each of the first to third pixels PXL1 to PXL3 may be in a floating state in which it is electrically isolated, but the present invention is not limited thereto.

Herein, a structure of the light emitting device according to an embodiment of the present invention will be described along a stacking order with reference to FIGS. 7 and 8.

The buffer layer BFL may be provided on the substrate SUB.

The semiconductor layer SCL of each of the first and second transistors T1 and T2 may be provided on the buffer layer BFL.

The gate insulating layer GI may be provided on the substrate SUB on which the semiconductor layer SCL is provided.

The gate electrode GE of each of the first and second transistors T1 and T2 and the driving voltage line DVL may be provided on the gate insulating layer GI. A second driving voltage VSS may be applied to the driving voltage line DVL.

The interlayer insulating layer ILD may be provided on the substrate SUB on which the gate electrode GE and the like are provided.

The first and second terminals EL1 and EL2 of each of the first and second transistors T1 and T2 and the bridge pattern BRP may be provided on the interlayer insulating layer ILD.

The first and second terminals EL1 and EL2 are different electrodes. For example, when the first terminal EL1 is a drain electrode, the second terminal EL2 may be a source electrode.

The bridge pattern BRP may be electrically connected to the driving voltage line DVL through the contact hole penetrating the interlayer insulating layer ILD.

The protective layer PSV may be provided on the substrate SUB on which the bridge pattern BRP and the like are provided. The protective layer PSV may include a contact hole exposing the first terminal EL1 of the first transistor T1 and a contact hole exposing the bridge pattern BRP.

The first and second banks PW1 and PW2 may be provided on the protective layer PSV. The first and second banks PW1 and PW2 may be spaced apart from each other at a certain distance on the protective layer PSV.

The (1-1)th electrode REL1_1, the (1-2)th electrode REL1_2, the second electrode REL2, the (1-1)th connection line CNL1_1, and the (2-1)th connection line CNL2_1 may be provided on the substrate SUB on which the first and second banks PW1 and PW2 and the like are provided.

The (1-1)th electrode REL1_1, the (1-2)th electrode REL1_2, and the second electrode REL2 may be spaced apart from each other at a certain distance on the substrate SUB.

The (1-1)th electrode REL1_1 may be connected to the first terminal EL1 of the first transistor T1 through a contact hole of the protective layer PSV, which exposes the first terminal EL1 of the first transistor T1. Therefore, a voltage applied to the first terminal EL1 of the first transistor T1 may be applied to the (1-1)th electrode REL1_1.

The second electrode REL2 may be connected to the bridge pattern BRP through a contact hole of the protective layer PSV, which exposes the bridge pattern BRP. Therefore, the second driving voltage VSS of the driving voltage line DVL may be applied to the second electrode REL2 through the bridge pattern BRP.

The (1-1)th capping layer CPL1_1, the (1-2)th capping layer CPL1_2, the second capping layer CPL2, the (1-2)th connection line CNL1_2, and the (2-2)th connection line CNL2_2 may be provided on the substrate SUB on which the (1-1)th electrode REL1_1 and the like are provided.

A first insulating layer INS1 may be provided on the substrate SUB on which the (1-1)th capping layer CPL1_1 and the like are provided. The first insulating layer INS1 may overlap with a portion of the first capping layer CPL1 of each of the first to third pixels PXL1 to PXL3 to cover the portion of the first capping layer CPL1. Also, the first insulating layer INS1 may be disposed between the substrate SUB and one light emitting element LD in each of the first to third pixels PXL1 to PXL3.

The insulating pattern INS1 disposed between the substrate SUB and the one light emitting element LD may stably support the one light emitting element LD, and prevent or substantially prevent separation of the one light emitting element LD.

The conductive pattern CP may be provided on the substrate SUB on which the first insulating layer INS1 is provided. The conductive pattern CP may partially overlap with the first electrode REL1 of each of the first to third pixels PXL1 to PXL3.

The light emitting elements LD may be aligned on the substrate SUB on which the conductive pattern CP is provided. The light emitting elements LD may be self-aligned through the electric field formed between the first and second electrodes REL1 and REL2 of each of the first to third pixels PXL1 to PXL3 to be provided between the first and second electrodes REL1 and REL2 of a corresponding pixel PXL.

The second insulating layer INS2 covering a portion of the upper surface of each of the light emitting elements LD may be provided on the substrate SUB on which the light emitting elements LD are provided.

The (1-1)th contact electrode CNE1_1 and the (1-2)th contact electrode CNE1_2 may be provided on the substrate SUB on which the second insulating layer INS2 is provided.

The (1-1)th contact electrode CNE1_1 may be provided on the (1-1)th electrode REL1_1 and the first end portion EP1 of the first light emitting element LD1 to be electrically connected to each of the (1-1)th electrode REL1_1 and the first end portion EP1 of the first light emitting element LD1.

Therefore, the first end portion EP1 of the first light emitting element LD1 may be connected to the (1-1)th electrode REL1_1. The (1-1)th electrode REL1_1 connected to the first transistor T1 of each of the first to third pixels PXL1 to PXL3, and hence a voltage applied to the first transistor T1 may be finally applied to the first end portion EP1 of the first light emitting element LD1.

The (1-2)th contact electrode CNE1_2 may be provided on the (1-2)th electrode REL1_2 and the second end portion EP2 of the second light emitting element LD2 to be electrically connected to each of the (1-2)th electrode REL1_2 and the second end portion EP2 of the second light emitting element LD2.

Therefore, the second end portion EP2 of the second light emitting element LD2 may be connected to the (1-2)th electrode REL1_2. The (1-2)th electrode REL1_2 may be electrically connected to a signal line (not shown) provided in the pixel circuit layer PCL of a corresponding pixel PXL. Therefore, a voltage applied to the signal line may be applied to the second end portion EP2 of the second light emitting element LD2 through the (1-2)th electrode REL1_2.

The third insulating layer INS3 may be provided on the substrate SUB on which the (1-1)th contact electrode CNE1_1 and the (1-2)th contact electrode CNE1_2 are provided.

The second contact electrode CNE2 may be provided on the substrate SUB on which the third insulating layer INS3 is provided.

The second contact electrode CNE2 may be provided on the second electrode REL2, the second end portion EP2 of the first light emitting element LD1, and the first end portion EP1 of the second light emitting element LD2.

The one side of the second contact electrode CNE2 may be electrically connected to each of the one side of the second electrode REL2 and the second end portion EP2 of the first light emitting element LD1.

Therefore, the second end portion EP2 of the first light emitting element LD1 may be electrically connected to the one side of the second electrode REL2. The second electrode REL2 is connected to the driving voltage line DVL, and hence the second driving voltage VSS applied to the driving voltage line DVL may be finally applied to the second end portion EP2 of the first light emitting element LD1.

Consequently, an electric field having a voltage (e.g., a predetermined voltage) or more is applied to each of the first and second end portions EP1 and EP2 of the first light emitting element LD1, such that the light emitting element LD1 emits light.

In addition, the other side of the second contact electrode CNE2 may be electrically connected to each of the other side of the second electrode REL2 and the first end portion EP1 of the second light emitting element LD2.

Therefore, the first end portion EP1 of the second light emitting element LD2 may be electrically connected to the other side of the second electrode REL2. The second electrode REL2 is connected to the driving voltage line DVL, and hence the second driving voltage VSS applied to the driving voltage line DVL may be finally applied to the first end portion EP1 of the second light emitting element LD2.

Consequently, an electric field having voltage (e.g., a predetermined voltage) or more is applied to each of the first and second end portions EP1 and EP2 of the second light emitting element LD2, such that the second light emitting element LD2 emits light.

The fourth insulating layer INS4 and the overcoat layer OC may be provided on the substrate SUB on which the second contact electrode CNE is provided.

As described above, in the display device according to an embodiment of the present invention, the light emitting elements LD are aligned in only the unit light emitting region of a corresponding pixel PXL, using the conductive pattern CP. Thus, the light emitting elements LD can be prevented or substantially prevented from being aligned in an unwanted region.

Further, in the display device according to an embodiment of the present invention, the first insulating layer INS1 is disposed between the substrate SUB and one light emitting element LD in the unit light emitting region of a corresponding pixel PXL, to stably support the one light emitting element LD. Thus, separation of the one light emitting element LD may be prevented or substantially prevented.

Further, in the display device according to an embodiment of the present invention, the first and second capping layers CPL1 and CPL2 are respectively disposed on the first and second electrodes REL1 and REL2 in the unit light emitting region of a corresponding pixel PXL, to protect the first and second electrodes REL1 and REL2. Thus, adhesion between the first and second electrodes REL1 and REL2 and the substrate SUB may be further improved.

In the display device according to an embodiment of the present invention, the first contact electrode CNE1 and the second contact electrode CNE2 may be disposed in different layers in the unit light emitting region of a corresponding pixel PXL.

Therefore, a process of connecting one of both the end portions EP1 and EP2 of each of the light emitting elements LD to the first electrode REL1 may be first performed, and a process of connecting the other of both the end portions EP1 and EP2 of each of the light emitting elements LD to the second electrode REL2 may be then performed. That is, a process of electrically connecting electrodes respectively corresponding to both the end portions EP1 and EP2 of each light emitting element LD may be separated.

Accordingly, in the display device according to the embodiment of the present invention, both the end portions EP1 and EP2 of each of the light emitting elements LD and electrodes corresponding thereto are in stable contact with each other, such that a contact defect of the light emitting elements LD can be minimized or reduced.

FIGS. 9A to 9H are schematic plan views sequentially illustrating a fabricating method of a display device including a plurality of unit light emitting regions.

In FIGS. 9A to 9H, illustration of a pixel circuit layer and signal lines connected to the pixel circuit layer will be omitted for convenience of description. Also, in FIGS. 9A to 9H, a case in which a plurality of light emitting elements are arranged in a horizontal direction is illustrated for convenience of description, but the arrangement of the light emitting elements is not limited thereto.

Also, in FIGS. 9A to 9H, a case in which three pixels are provided in a display region of a substrate is illustrated for convenience of description, but three or more pixels are actually provided in the display region of the substrate.

Referring to FIGS. 1 to 9A, first and second banks PW1 and PW2 extending in a second direction DR2 are formed on a substrate SUB.

The substrate SUB may include a display region DA and a non-display region NDA. The first and second banks PW1 and PW2 may be provided in the display region DA of the substrate SUB.

The first bank PW1 may include a (1-1)th bank PW1_1 and a (1-2)th bank PW1_2, which are spaced apart from each other at a certain distance on the substrate SUB with the second bank PW2 interposed therebetween.

A pixel circuit layer PCL may be provided on the bottom of the substrate SUB. A contact hole CH for electrically connecting the substrate SUB to the pixel circuit layer PCL may be provided in the display region DA of the substrate SUB.

Subsequently, referring to FIGS. 1 to 9B, first and second electrodes REL1 and REL2, a (1-1)th metal layer MTL1_1, a (2-1)th metal layer MTL2_1, a first alignment line ARL1, and a second alignment line ARL2 are formed on the substrate SUB on which the first and second banks PW1 and PW2 are provided.

The first and second electrodes REL1 and REL2, the (1-1)th metal layer MTL1_1, and the (2-1)th metal layer MTL2_1 may be provided in the display region DA of the substrate SUB. The first and second alignment lines ARL1 and ARL2 may be provided in the non-display region NDA of the substrate SUB.

In an embodiment of the present invention, the first and second electrodes REL1 and REL2, the (1-1)th and (2-1)th metal layers MTL1_1 and MTL2_1, and the first and second alignment lines ARL1 and ARL2 may be provided on the same plane. That is, the first and second electrodes REL1 and REL2, the (1-1)th and (2-1)th metal layers MTL1_1 and MTL2_1, and the first and second alignment lines ARL1 and ARL2 may be provided in the same layer.

In an embodiment, the first and second electrodes REL1 and REL2, the (1-1)th and (2-1)th metal layers MTL1_1 and MTL2_1, and the first and second alignment lines ARL1 and ARL2 may include the same material. For example, the first and second electrodes REL1 and REL2, the (1-1)th and (2-1)th metal layers MTL1_1 and MTL2_1, and the first and second alignment lines ARL1 and ARL2 may include a conductive material having a constant reflexibility.

In an embodiment, the first electrode REL1, the (1-1)th metal layer MTL1_1, and the first alignment line ARL1 may be integrally provided to be electrically and physically connected to one another. In addition, in an embodiment, the second electrode REL2, the (2-1)th metal layer MTL2_1, and the second alignment line ARL2 may be integrally provided to be electrically and physically connected to one another.

When viewed on a plane, the (1-1)th metal layer MTL1_1 and the (2-1)th metal layer MTL2_1 may extend along a first direction DR1 intersecting the second direction DR2. The first alignment line ARL1 and the second alignment line ARL2 may extend along the second direction DR2.

The first electrode REL1 connected to the (1-1)th metal layer MTL1_1 may include a (1-1)th electrode REL1_1 and a (1-2)th electrode REL1_2, which respectively branch off to one side and the other side of the second electrode REL2.

Therefore, the (1-1)th and (1-2)th electrodes REL1_1 and REL1_2 and the second electrode REL2 may be alternately disposed on the substrate SUB. In particular, when viewed on a plane, the second electrode REL2 may be disposed between the (1-1)th electrode REL1_1 and the (1-2)th electrode REL1_2.

The (1-1)th electrode REL1_1 may overlap with the (1-1)th bank PW1_1, the (1-2)th electrode REL1_2 may overlap with the (1-2)th bank PW1_2, and the second electrode REL2 may overlap with the second bank PW2.

In an embodiment of the present invention, one (1-1)th electrode REL1_1 one (1-2)th electrode REL1_2, and one second electrode REL2 provided between the (1-1)th and (1-2)th electrodes REL1_1 and REL1_2 may implement a unit light emitting region of each of first to third pixels PXL1 to PXL3 on the substrate SUB. That is, each of the first to third pixels PXL1 to PXL3 may include the unit light emitting region.

In an embodiment of the present invention, the first electrode REL1 may be an anode electrode, and the second electrode REL2 may be a cathode electrode. The first electrode REL1 as the anode electrode may be electrically and physically connected to the first alignment line ARL1, and the second electrode REL2 as the cathode electrode may be electrically and physically connected to the second alignment line ARL2.

The (1-1)th metal layer MTL1_1 and the (2-1)th metal layer MTL2_1 may be commonly provided to the first to third pixels PXL1 to PXL3.

Therefore, the first electrode REL1 provided in the unit light emitting region of each of the first to third pixels PXL1 to PXL3 may be connected to a first electrode REL1 provided in the unit light emitting region of an adjacent pixel through the (1-1)th metal layer MTL1_1. In addition, the second electrode REL2 provided in the unit light emitting region of each of the first to third pixels PXL1 to PXL3 may be connected to a second electrode REL2 provided in the unit light emitting region of an adjacent pixel through the (2-1)th metal layer MTL2_1.

Subsequently, referring to FIGS. 1 to 9C, a first capping layer CPL1, a second capping layer CPL2, a (1-2)th metal layer MTL1_2, and a (2-2)th metal layer MTL2_2 are formed in the display region DA of the substrate SUB on which the first electrode REL1 and the like are provided.

In an embodiment of the present invention, the first and second capping layer CPL1 and CPL2 and the (1-2)th and (2-2)th metal layers MTL1_2 and MTL2_2 may be provided in the same layer.

In an embodiment, the first and second capping layer CPL1 and CPL2 and the (1-2)th and (2-2)th metal layers MTL1_2 and MTL2_2 may include the same material. For example, the first and second capping layer CPL1 and CPL2 and the (1-2)th and (2-2)th metal layers MTL1_2 and MTL2_2 may include a transparent conductive material.

In an embodiment of the present invention, the first capping layer CPL1 and the (1-2)th metal layer MTL1_2 may be integrally provided to be electrically and physically connected to each other. In addition, in an embodiment, the second capping layer CPL2 and the (2-2)th metal layer MTL2_2 may be integrally provided to be electrically and physically connected to each other.

The first capping layer CPL1 connected to the (1-2)th metal layer MTL1_2 may include a (1-1)th capping layer CPL1_1 and a (1-2)th capping layer CPL1_2, which branch off to one side and the other side of the second capping layer CPL2. The second capping layer CPL2 may be disposed between the (1-1)th capping layer CPL1_1 and the (1-2)th capping layer CPL1_2.

When viewed on a plane, the (1-1)th capping layer CPL1_1 may overlap with the (1-1)th electrode REL1_1, the (1-2)th capping layer CPL1_2 may overlap with the (1-2)th electrode REL1_2, and the second capping layer CPL2 may overlap with the second electrode REL2.

The (1-2)th metal layer MTL1_2 may extend in the first direction DR1 and overlap with the (1-1)th metal layer MTL1_1. The (2-2)th metal layer MTL2_2 may extend in the first direction DR1 and overlap with the (2-1)th metal layer MTL2_1.

A first insulating material layer (not shown) may be formed on the substrate SUB on which the first capping layer CPL1 and the like are provided.

Referring to FIGS. 1 to 9D, a conductive pattern CP is formed on the substrate SUB on which the first insulating material layer is provided.

When viewed on a plane, the conductive pattern CP may be provided in a shape surrounding edges of the first and second electrodes REL1 and REL2 in a unit light emitting region of a corresponding pixel.

The conductive pattern CP may partially overlap with the first electrode REL1 in a unit light emitting region of a corresponding pixel. Specifically, the conductive pattern CP partially overlaps with the (1-1)th electrode REL1_1 in a unit light emitting region of a corresponding pixel, and may partially overlap with the (1-2)th electrode REL1_2.

In an embodiment of the present invention, the conductive pattern CP may define alignment regions of light emitting elements LD which will be described later in the unit light emitting region of each of the first to third pixels PXL1 to PXL3. Specifically, the conductive pattern CP may function to allow the light emitting elements LD to be aligned in only a desired region of the light emitting elements LD, e.g., a unit light emitting region of a corresponding pixel in a process of aligning the light emitting elements LD.

The conductive pattern CP may be made of a conductive material such as molybdenum Mo, and be in a floating state in which it is electrically isolated.

Referring to FIGS. 1 to 9E, a voltage is applied to the first and second alignment lines ARL1 and ARL2 such that an electric field is formed between first and second electrodes REL1 and REL2.

In an embodiment of the present invention, voltages (e.g., predetermined voltages) having different levels may be respectively applied to the first alignment line ARL1 and the second alignment line ARL2. For example, a ground voltage may be applied to the first alignment line ARL1, and an AC voltage may be applied to the second alignment line ARL2.

When the voltages (e.g., predetermined voltages) having different levels are respectively applied to the first alignment line ARL1 and the second alignment line ARL2, the electric field may be formed between the first electrode REL1 and the second electrode REL2.

In an embodiment the ground voltage is applied to the first electrode REL1 to not have influence on electrical characteristics of transistors (see T1 to T7 of FIG. 6) included in the pixel circuit layer PCL connected to the first electrode REL1.

In an embodiment, the first electrode REL1 is an anode electrode electrically connected to the pixel circuit layer PCL. Hence, when an AC or DC voltage having a voltage level (e.g., a predetermined voltage) level instead of the ground voltage is applied to the first electrode REL1, threshold voltages of the transistors T1 to T7 may be changed since the transistors T1 to T7 are influenced by the voltage applied to the first electrode REL1. Therefore, the pixel circuit layer PCL may malfunction since the electrical characteristics of the transistors T1 to T7 are changed.

In an embodiment of the present invention, in order to prevent or substantially prevent the malfunction of the pixel circuit layer PCL, the ground voltage may be applied to the first electrode REL1, and a voltage having a voltage level (e.g., a predetermined voltage level) may be applied to the second electrode REL2.

As described above, the light emitting elements LD may be scattered on the substrate SUB in a state in which an electric field is applied between the first and second electrodes REL1 and REL2.

An inkjet printing technique may be used as a non-restrictive example of a technique of scattering the light emitting elements LD. In an example, the light emitting elements LD may be scattered in the display region DA by disposing a nozzle on a corresponding substrate SUB and dropping a solution including the light emitting elements LD. However, the technique of scattering the light emitting elements LD on the substrate SUB is not limited thereto.

When the light emitting elements LD are dropped, the light emitting elements LD may be self-aligned since an electric field is formed between the first electrode REL1 and the second electrode REL2. When a voltage is applied to each of the first and second electrodes REL1 and REL2, the light emitting elements LD may be self-aligned between the first and second electrodes REL1 and REL2 by the electric field formed between the first and second electrodes REL1 and REL2.

The light emitting elements LD may be aligned in a unit light emitting region of a corresponding pixel by the conductive pattern CP. Specifically, the light emitting elements LD may be aligned between the first electrode REL1 and the second electrode REL2 in the unit light emitting region of each of the first to third pixels PXL1 to PXL3.

The light emitting elements LD may include a first light emitting element LD1 aligned between the (1-1)th and second electrodes REL1_1 and REL2 in a unit light emitting region of a corresponding pixel and a second light emitting element LD2 aligned between the second and (1-2)th electrodes REL2 and REL1_2 in the unit light emitting region of the corresponding pixel.

As described above, voltages having different levels are respectively applied to the first and second alignment lines ARL1 and ARL2, such that the light emitting elements LD can be easily aligned on the substrate SUB.

After the light emitting elements LD are aligned, a first insulating pattern (not shown) exposing a portion of the first capping layer CPL1 to the outside may be formed by patterning the first insulating material layer.

Referring to FIGS. 1 to 9F, the first alignment line ARL1 and the second alignment line ARL2 are removed on the substrate SUB on which the light emitting elements LD are aligned.

At the same time, a (1-1)th connection line CNL1_1 is formed by removing a portion of the (1-1)th metal layer MTL1_1 electrically connected to the first alignment line ARL1 in the display region DA of the substrate SUB.

A (1-2)th connection line CNL1_2 may also be formed by removing a portion of the (1-2)th metal layer MTL1_2 together with the portion of the (1-1)th metal layer MTL1_1. The (1-1)th connection line CNL1_1 along with the (1-2)th connection line CNL1_2 may constitute a first connection line CNL1.

When the second alignment line ARL2 is removed, the (2-1)th metal layer MTL2_1 electrically and physically connected to the second alignment line AR2 may become a (2-1)th connection line CNL2_1.

The (2-2)th metal layer MTL2_2 may become a (2-2)th connection line CNL2_2. The (2-1)th connection line CNL2_1 along the (2-2)th connection line CNL2_2 may constitute a second connection line CNL2.

A second insulating pattern (not shown) exposing a portion of the first capping layer CPL1 and one end portions of the light emitting elements LD may be formed by forming and patterning a second insulating material layer (not shown) on the substrate SUB on which the first and second connection lines CNL1 and CNL2 are provided.

Referring to FIGS. 1 to 9G, a first contact electrode CNE1 is formed on the substrate SUB on which the second insulating pattern and the like are provided.

When viewed on a plane, the first contact electrode CNE1 may overlap with the first electrode REL1. The first contact electrode CNE1 may include a (1-1)th contact electrode CNE1_1 formed on the (1-1)th electrode REL1_1 and a (1-2)th contact electrode CNE1_2 formed on the (1-2)th electrode REL1_2.

The (1-1)th contact electrode CNE1_1 may electrically and/or physically connect one end portion EP1 of the first light emitting element LD1 and the (1-1)th electrode REL1_1. In addition, the (1-2)th contact electrode CNE1_2 may electrically and/or physically connect the other end portion EP2 of the second light emitting element LD2 and the (1-2)th electrode REL1_2.

Subsequently, a third insulating layer INS3 covering the first contact electrode CNE1 is formed by forming and patterning a third insulating material layer (not shown) on the substrate SUB on which the first contact electrode CNE1 is formed.

At the same time, first and second insulating layers INS1 and INS2 exposing the other end portion of each of the light emitting elements LD and the second capping layer CPL2 to the outside are formed by patterning the first and second insulating patterns.

Referring to FIGS. 1 to 9H, a second contact electrode CNE2 is formed on the substrate SUB on which the first contact electrode CNE1 and the like are provided.

When viewed on a plane, the second contact electrode CNE2 may overlap with the second electrode REL2. Also, when viewed on a plane, the second contact electrode CNE2 may overlap with the other end portion EP2 of the first light emitting element LD1 and the one end portion EP1 of the second light emitting element LD2.

The second contact electrode CNE2 may electrically and/or physically connect one side of the second electrode REL2 and the other end portion EP2 of the first light emitting element LD1. Also, the second contact electrode CNE2 may electrically and/or physically connect the other side of the second electrode REL2 and the one end portion EP1 of the second light emitting element LD2.

FIGS. 10A to 10M are cross-sectional views sequentially illustrating a fabricating method of the display device shown in FIG. 8.

Referring to FIGS. 1 to 10A, a pixel circuit layer PCL is formed on a substrate SUB. The pixel circuit layer PCL may include first and second transistors T1 and T2, a driving voltage line DVL, a bridge pattern BRP connected to the driving voltage line DVL, and a protective layer PSV.

The protective layer PSV may include a contact hole (herein, referred to as a 'first contact hole') exposing a first terminal EL1 of the first transistor T1 and a contact hole (herein, referred to as a 'second contact hole') exposing the bridge pattern BRP.

Referring to FIGS. 1 to 10B, first and second banks PW1 and PW2 are formed on the pixel circuit layer PCL.

The first and second banks PW1 and PW2 may be spaced apart from each other at a certain distance on the protective layer PSV. In an embodiment of the present invention, the first and second banks PW1 and PW2 may include an organic insulating layer.

The first bank PW1 may include a (1-1)th bank PW1_1 and a (1-2)th bank PW1_2, which are spaced apart from each other at a certain distance with the second bank PW2 interposed therebetween.

Referring to FIGS. 1 to 10C, first and second electrodes REL1 and REL2 including a conductive material having a high reflexibility are formed on the protective layer PSV on which the first and second banks PW1 and PW2 are provided.

The first electrode REL1 may be formed on the first bank PW1, and the second electrode REL2 may be formed on the second bank PW2. The first electrode REL1 may include a (1-1)th electrode REL1_1 formed on the (1-1)th bank PW1_1 and a (1-2)th electrode REL1_2 formed on the (1-2)th bank PW1_2.

The (1-1)th electrode REL1_1 may be connected to the first terminal EL1 of the first transistor T1 through the first contact hole penetrating the protective layer PSV. The second electrode REL2 may be connected to the bridge pattern BRP through the second contact hole penetrating the protective layer PSV.

In an embodiment, each of the first and second electrodes REL1 and REL2 may have a shape corresponding to that of a corresponding bank. That is, the first electrode REL1 may have a shape corresponding to that of the first bank PW1, and the second electrode REL2 may have a shape corresponding to that of the second bank PW2.

Referring to FIGS. 1 to 10D, first and second capping layers CPL1 and CPL2 including a transparent conductive material are formed on the protective layer PSV on which the first and second electrodes REL1 and REL2 are formed.

Referring to FIGS. 1 to 10E, in an embodiment, a first insulating material layer INS1' is entirely deposited on the protective layer PSV on which the first and second capping layers CPL1 and CPL2 are provided.

In an embodiment, the first insulating material layer INS1' may be an inorganic insulating layer including an inorganic material. The first insulating material layer INS1' along with the first and second capping layers CPL1 and CPL2 may cover the first and second electrodes REL1 and REL2, and protect the first and second electrodes REL1 and REL2.

Referring to FIGS. 1 to 10F, a conductive pattern CP made of a conductive material is formed on the first insulating material layer INS1'.

The conductive pattern CP may partially overlap with the first capping layer CPL1 and the first electrode REL1 disposed on the bottom thereof. The conductive pattern CP functions to allow light emitting elements LD which will be described later to be aligned in a unit light emitting region of a corresponding pixel.

Referring to FIGS. 1 to 10G, after an electric field is formed between the first and second electrodes REL1 and REL2 by respectively applying predetermined voltages to the first and second electrodes REL1 and REL2 through the first and second alignment lines ARL1 and ARL2, the light emitting elements LD are scattered on the first insulating material layer INS1'.

When the light emitting elements LD are scattered, the electric field is formed between the (1-1)th electrode REL1_1 and the second electrode REL2 and between the second electrode REL2 and the (1-2)th electrode REL1_2, and hence the light emitting elements LD may be self-aligned.

In an embodiment of the present invention, the light emitting elements LD may include a first light emitting element LD1 aligned between the (1-1)th electrode REL1_1 and the second electrode REL2 and a second light emitting element LD2 aligned between the second electrode REL2 and the (1-2)th electrode REL1_2.

Each of the first and second light emitting elements LD1 and LD2 may include first and second end portions EP1 and EP2.

Referring to FIGS. 1 to 10H, a first insulating pattern INS1" exposing a portion of the first capping layer CPL1 is formed by patterning the first insulating material layer INS1' through a mask process, etc.

Referring to FIGS. 1 to 10I, a second insulating material layer (not shown) is coated on the protective layer PSV on which the first insulating pattern INS1" and the like are provided. Subsequently, a second insulating pattern INS2' exposing a portion of the first capping layer CPL1, the first end portion EP1 of the first light emitting element LD1, and the second end portion EP2 of the second light emitting element LD2 is formed through a mask process, etc.

At the same time, the first and second alignment lines ARL1 and ARL2 are removed, and first and second connection lines CNL1 and CNL2 are formed.

Referring to FIGS. 1 to 10J, a first contact electrode CNE1 including (1-1)th and (1-2)th contact electrodes CNE1_1 and CNE1_2 is formed on the protective layer PSV including the second insulating pattern INS2'.

The (1-1)th contact electrode CNE1_1 may cover the (1-1)th electrode REL1_1 and the first end portion EP1 of the first light emitting element LD1, and the (1-2)th contact electrode CNE1_2 may cover the (1-2)th electrode REL1_2 and the second end portion EP2 of the second light emitting element LD2.

Referring to FIGS. 1 to 10K, a third insulating material layer (not shown) is coated on the protective layer PSV on which the first contact electrode CNE1 is provided. Subsequently, a third insulating layer INS3 covering the first contact electrode CNE1 and exposing the second electrode REL2 to the outside is formed using a mask process, etc.

When the third insulating layer INS3 is provided in a multi-layer including a plurality of insulating layers, the plurality of insulating layers may be concurrently (e.g., simultaneously) or individually patterned by the mask process, to expose the second electrode REL2 to the outside.

The second insulating pattern INS2' may be patterned together with the plurality of insulating layers by the mask process, to become a second insulating layer INS2 exposing the second capping layer CPL2, the second end portion EP2 of the first light emitting element LD1, and the first end portion EP1 of the second light emitting element LD2. The second insulating layer INS2 is provided at a portion of an upper surface of each of the first and second light emitting elements LD1 and LD2 to expose both the end portions EP1 and EP2 of each of the first and second light emitting elements LD1 and LD2 to the outside.

In addition, the first insulating pattern INS1" may be patterned together with the plurality of insulating layers, to become a first insulating layer INS1 provided on only the bottom of each of the first and second light emitting elements LD1 and LD2 and a portion of the first capping layer CPL1.

The first insulating layer INS1 disposed on the bottom of each of the first and second light emitting elements LD1 and LD2 may function to support the first and second light emitting elements LD1 and LD2 and prevent or substantially prevent separation of the first and second light emitting elements LD1 and LD2.

Referring to FIGS. 1 to 10L, a second contact electrode CNE2 is formed on the protective layer PSV including the third insulating layer INS3.

The second contact electrode CNE2 may cover the second electrode REL2, the second end portion EP2 of the first light emitting element LD1, and the first end portion EP1 of the second light emitting element LD2.

Referring to FIGS. 1 to 10M, in an embodiment, a fourth insulating layer INS4 is entirely formed on the protective layer PSV including the second contact electrode CNE2. Subsequently, in an embodiment, an overcoat layer OC is formed on the fourth insulating layer INS4.

Figure 11:
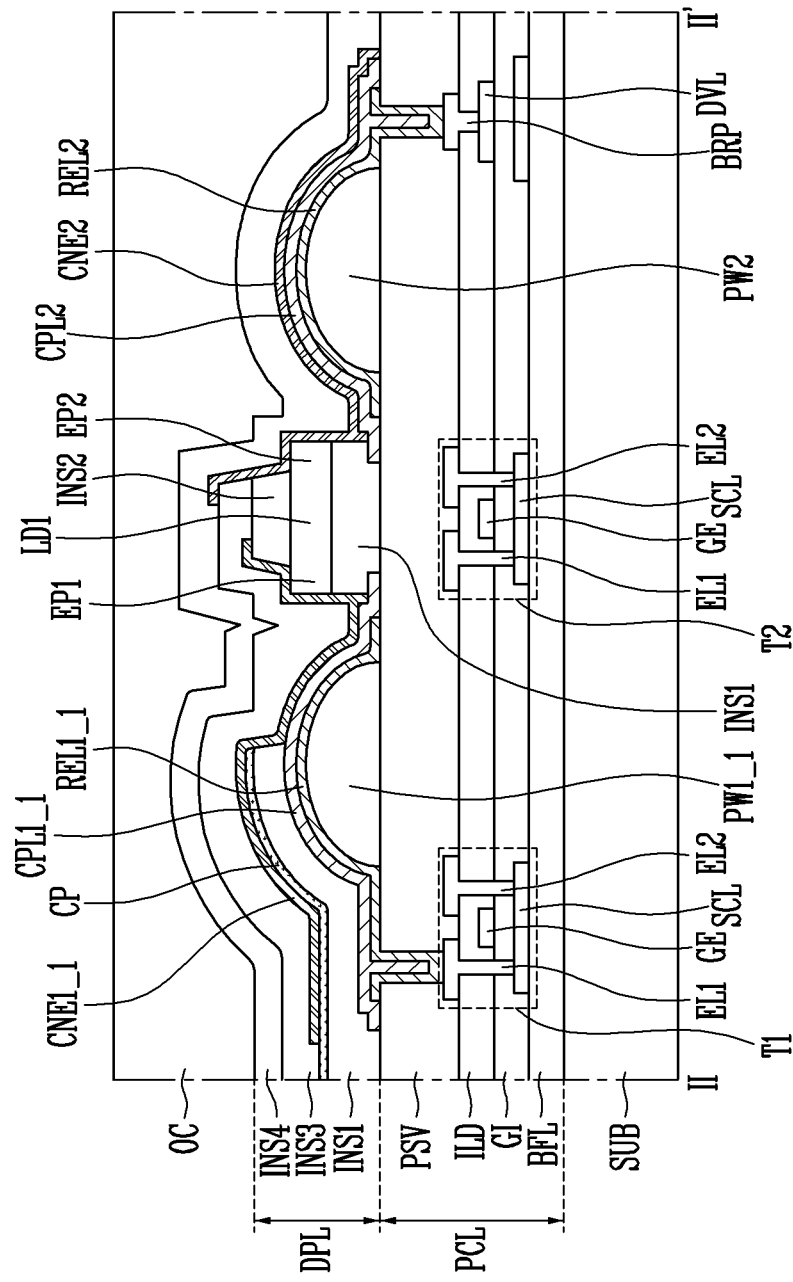
FIG. 11 illustrates another form of first and second banks shown in FIG. 8, which is a cross-sectional view corresponding to the line II-II' of FIG. 7.

FIG. 11 illustrates another form of the first and second banks shown in FIG. 8, which is a cross-sectional view corresponding to the line II-II' of FIG. 7. In the present embodiment, portions different from those of the above-described embodiment will be mainly described to avoid redundancy. Portions not particularly described in the present embodiment may follow those of the above-described embodiment. In addition, like reference numerals refer to like components, and similar reference numerals refer to similar components.

A display device shown in FIG. 11 may have a configuration the same or similar to that of the display device of FIGS. 7 and 8, except that first and second bank have a semicircular shape.

Referring to FIGS. 7 and 8, the display device according to an embodiment of the present invention may include a substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistors T1 and T2 disposed on the buffer layer BFL, and a driving voltage line DVL.

The display element layer DPL may include first and second banks PW1 and PW2, first and second electrodes REL1 and REL2, light emitting elements LD, and first and second contact electrodes CNE1 and CNE2, which are provided on the pixel circuit layer PCL.

The first and second banks PW1 and PW2 may have a shape protruding from a protective layer PSV of the pixel circuit layer PCL, and a surface of each of the first and second banks PW1 and PW2 may be provided in a semi-circular shape having a curvature (e.g., a predetermined curvature). However, the present invention is not limited thereto.

The first and second banks PW1 and PW2 may be an organic insulating layer including an organic material, but the present invention is not limited thereto.

In an embodiments, the first and second electrodes REL1 and REL2 may be provided to correspond to the shapes of the first and second banks PW1 and PW2. That is, in an embodiment, the first electrode REL1 may have a curvature corresponding to the shape of the first bank PW1, and the second electrode REL2 may have a curvature corresponding to the shape of the second bank PW2.

In an embodiment of the present invention, the first and second electrodes REL1 and REL2 may be made of a conductive material having a constant reflexibility. The first and second electrodes REL1 and REL2 may allow lights emitted from both end portions EP1 and EP2 of each of the light emitting elements LD to advance in a direction (e.g., a front direction) in which an image is displayed.

As described above, since the first and second electrodes REL1 and REL2 have a shape having a curvature, lights emitted from both the end portions EP1 and EP2 of each of the light emitting elements LD and then reflected by the first and second electrodes REL1 and REL2 can further advance in the front direction.

The display device according to the embodiment of the present invention may be employed in any of various electronic devices. For example, the display device is applicable to televisions, notebook computers, cellular phones, smartphones, smart pads, PMPs, PDAs, navigations, various wearable devices such as smart watches, and the like.

While the present invention has been described in connection with some exemplary embodiments, it will be understood by those skilled in the art that various modifications and changes can be made thereto without departing from the spirit and scope of the invention as set forth in the appended claims.

Thus, the scope of the invention should not be limited by the particular embodiments described herein but should be defined by the appended claims and equivalents thereof.

What is claimed is:

1. A display device comprising:
   a substrate; and
   pixels on the substrate, including a first pixel and a second pixel adjacent to each other in a first direction;
   wherein the pixels include:
      a pixel circuit on the substrate;
      a first connection line on the substrate and electrically connected to the pixel circuit;
      a second connection line on the substrate and spaced apart from the first connection line; and
      a light emitting element electrically connected to the first connection line and the second connection line and including a first end portion and a second end portion;
   wherein the first connection line includes a first base connection portion extending in the first direction and a first protruding connection portion extending in a second direction from the first base connection portion, the second direction being different from the first direction, the first protruding connection portion including first protruding connection portions, wherein the second connection line includes a second base connection portion extending in the first direction and a second protruding connection portion extending in the second direction from the second base connection portion, wherein the second protruding connection portion is surrounded by at least a portion of each of the first protruding connection portions and the first base connection portion in a plan view, wherein the first end portion is electrically connected to the first protruding connection portion, and the second end portion is electrically connected to the second protruding connection portion, wherein the first base connection portion of the first pixel and the first base connection portion of the second pixel are spaced apart from each other, and the second base connection portion of the first pixel and the second base connection portion of the second pixel are integral with each other, and wherein the second protruding connection portion has a rectangular shape, and the first base connection portion and the first protruding connection portion are disposed around three sides of the rectangular shape.

2. The display device of claim 1, wherein the first connection line and the second connection line are disposed in a same layer.

3. The display device of claim 2, wherein the first base connection portion includes a base end portion, and
wherein the base end portion of the first pixel and the base end portion of the second pixel face each other in the first direction.

4. The display device of claim 1, wherein the first base connection portion and the second base connection portion are spaced apart in the second direction.

5. The display device of claim 4, wherein the first protruding connection portion and the second protruding connection portion are spaced apart in the first direction.

6. The display device of claim 5, wherein the first end portion faces the first protruding connection portion, and
wherein the second end portion faces the second protruding connection portion.

7. The display device of claim 1, wherein one of the first protruding portions is disposed at a first side of the second protruding portion, and
wherein another one of the first protruding portions is disposed at a second side of the second protruding portion.

8. The display device of claim 7, wherein the light emitting element includes a first light emitting element disposed at the first side of the second protruding portion and a second light emitting element disposed at the second side of the second protruding portion.

9. The display device of claim 1, wherein the second protruding connection portion includes a protruding end portion facing a center area of the first base connection portion in the second direction.

10. The display device of claim 1, wherein a connecting portion of the second protruding connection portion is continuously connected to the second base connection portion, and
wherein the connecting portion is not arranged on the three sides.

11. The display device of claim 1, wherein an area is formed between the second protruding connection portion and the first protruding connection portions, and the area is bent at a longitudinal end of the second protruding connection portion.

12. The display device of claim 1, wherein the first base connection portion and the first protruding connection portion are integral, and
wherein the second base connection portion and the second protruding connection portion are integral.

13. The display device of claim 12, wherein the first protruding connection portion is a first electrode adjacent to the first end portion of the light emitting element, and
wherein the second protruding connection portion is a second electrode adjacent to the second end portion of the light emitting element.

14. The display device of claim 1, further comprising a protruding capping layer disposed on the first protruding connection portion and the second protruding connection portion and extending in the second direction.

15. The display device of claim 14, further comprising a base capping layer disposed on the first base connection portion and the second base connection portion and extending in the first direction.

16. The display device of claim 15, further comprising a bank adjacent to the light emitting element,
wherein the protruding capping layer entirely covers the bank and has a shape corresponding to the bank.

17. A display device comprising:
a substrate; and
pixels on the substrate, including a first pixel and a second pixel adjacent to each other in a first direction;
wherein the pixels include:
a pixel circuit on the substrate;
a first connection line on the substrate and electrically connected to the pixel circuit;
a second connection line on the substrate and spaced apart from the first connection line; and
a light emitting element electrically connected to the first connection line and the second connection line and including a first end portion and a second end portion;
wherein the first connection line includes a first base connection portion extending in the first direction and a first protruding connection portion extending in a second direction from the first base connection portion, the second direction being different from the first direction, the first protruding connection portion including first protruding connection portions,
wherein the second connection line includes a second base connection portion extending in the first direction and a second protruding connection portion extending in the second direction from the second base connection portion,
wherein the second protruding connection portion is surrounded by at least a portion of each of the first protruding connection portions and the first base connection portion in a plan view,
wherein the first end portion is electrically connected to the first protruding connection portion, and the second end portion is electrically connected to the second protruding connection portion,
wherein the first base connection portion of the first pixel and the first base connection portion of the second pixel are spaced apart from each other, and the second base connection portion of the first pixel and the second base connection portion of the second pixel are integral with each other, wherein the pixel circuit is electrically connected to the first base connection portion through a contact member, and wherein the first protruding connection portion is spaced apart from the contact member in the plan view.

18. A display device comprising:

a substrate; and pixels on the substrate, including a first pixel and a second pixel adjacent to each other in a first direction;

wherein the pixels include:

a pixel circuit on the substrate;

a first connection line on the substrate and electrically connected to the pixel circuit;

a second connection line on the substrate and spaced apart from the first connection line;

a light emitting element electrically connected to the first connection line and the second connection line and including a first end portion and a second end portion;

a first contact electrode electrically connected to the first end portion of the light emitting element;

a second contact electrode electrically connected to the second end portion of the light emitting element; and an insulating layer disposed between the first contact electrode and the second contact electrode, wherein the first connection line includes a first base connection portion extending in the first direction and a first protruding connection portion extending in a second direction from the first base connection portion, the second direction being different from the first direction, the first protruding connection portion including first protruding connection portions, wherein the second connection line includes a second base connection portion extending in the first direction and a second protruding connection portion extending in the second direction from the second base connection portion, wherein the second protruding connection portion is surrounded by at least a portion of each of the first protruding connection portions and the first base connection portion in a plan view, wherein the first end portion is electrically connected to the first protruding connection portion, and the second end portion is electrically connected to the second protruding connection portion, wherein the first base connection portion of the first pixel and the first base connection portion of the second pixel are spaced apart from each other, and the second base connection portion of the first pixel and the second base connection portion of the second pixel are integral with each other, and wherein the first contact electrode and the second contact electrode are disposed in different layers.

19. The display device of claim 18, further comprising an overcoat layer disposed on the second contact electrode.

* * * * *